(12) United States Patent
Lee et al.

(10) Patent No.: US 12,062,832 B2
(45) Date of Patent: Aug. 13, 2024

(54) ELECTRONIC DEVICE AND MANUFACTURING METHOD THEREOF

(71) Applicant: Taiwan Semiconductor Manufacturing Company, Ltd., Hsinchu (TW)

(72) Inventors: Pei-Hsuan Lee, Tainan (TW); Ching-Hua Hsieh, Hsinchu (TW); Chien-Ling Hwang, Hsinchu (TW); Yu-Ting Chiu, Hsinchu County (TW); Jui-Chang Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 22 days.

(21) Appl. No.: 17/383,403

(22) Filed: Jul. 22, 2021

(65) Prior Publication Data

US 2021/0351491 A1 Nov. 11, 2021

Related U.S. Application Data

(62) Division of application No. 16/379,819, filed on Apr. 10, 2019, now Pat. No. 11,075,439.

(60) Provisional application No. 62/712,225, filed on Jul. 31, 2018.

(51) Int. Cl.
| | |
|---|---|
| *H01L 23/66* | (2006.01) |
| *H01L 21/48* | (2006.01) |
| *H01L 23/00* | (2006.01) |
| *H01Q 1/22* | (2006.01) |
| *H01Q 1/40* | (2006.01) |

(52) U.S. Cl.
CPC ....... *H01Q 1/2283* (2013.01); *H01L 21/4846* (2013.01); *H01L 23/66* (2013.01); *H01L 24/13* (2013.01); *H01L 24/24* (2013.01); *H01L 24/32* (2013.01); *H01L 24/73* (2013.01); *H01Q 1/40* (2013.01); *H01L 2223/6677* (2013.01); *H01L 2224/13024* (2013.01); *H01L 2224/24101* (2013.01); *H01L 2224/24227* (2013.01); *H01L 2224/32225* (2013.01); *H01L 2224/73267* (2013.01)

(58) Field of Classification Search
None
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |

(Continued)

*Primary Examiner* — Jack S Chen
(74) *Attorney, Agent, or Firm* — JCIPRNET

(57) ABSTRACT

A method of manufacturing an electronic device includes providing a core dielectric layer with two conductive layers formed on two opposite surfaces of the core dielectric layer, and removing at least a portion of each of the two conductive layers to respectively form an antenna pattern and a circuit pattern of a chip package at the two opposite surfaces of the core dielectric layer.

9 Claims, 17 Drawing Sheets

(56) References Cited

U.S. PATENT DOCUMENTS 9,496,189 B2    11/2016  Yu et al.
2020/0313278 A1* 10/2020  Liang ..................... H01L 23/66

* cited by examiner

ELECTRONIC DEVICE AND MANUFACTURING METHOD THEREOF

CROSS-REFERENCE TO RELATED APPLICATION

This application is a divisional application of U.S. application Ser. No. 16/379,819, filed on Apr. 10, 2019. The prior application Ser. No. 16/379,819 claims the priority benefit of U.S. provisional application Ser. No. 62/712,225, filed on Jul. 31, 2018. The entirety of each of the above-mentioned patent applications is hereby incorporated by reference herein and made a part of this specification.

BACKGROUND

Semiconductor devices and integrated circuits are used in a variety of electronic applications, such as personal computers, cell phones, digital cameras, and other electronic devices. As the demand for shrinking electronic devices has grown, a need for smaller and more creative packaging techniques of semiconductor devices has emerged. Thus, packages such as wafer-level packaging (WLP) have begun to be developed. For example, the dies of the wafer may be processed and packaged with other semiconductor devices (e.g. antenna) at the wafer level. In addition, since the demand of modern communication for more bandwidth, high performance package designs with integrated antenna are desired.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
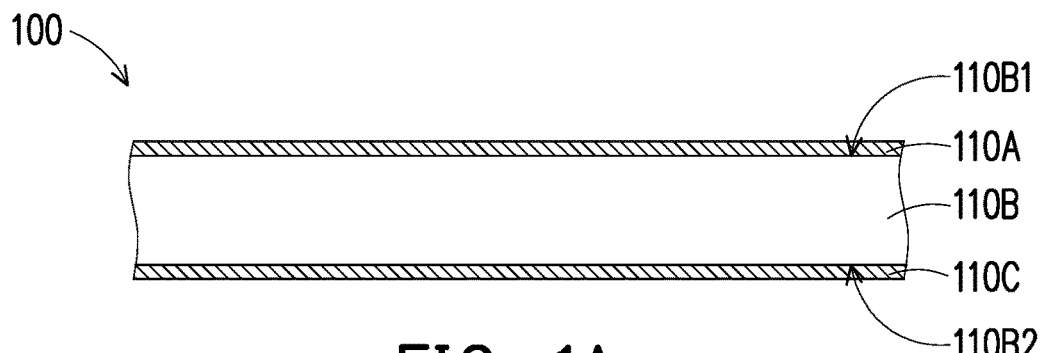
FIG. 1A to FIG. 1K are schematic cross-sectional views of various stages in a manufacturing method of an electronic device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
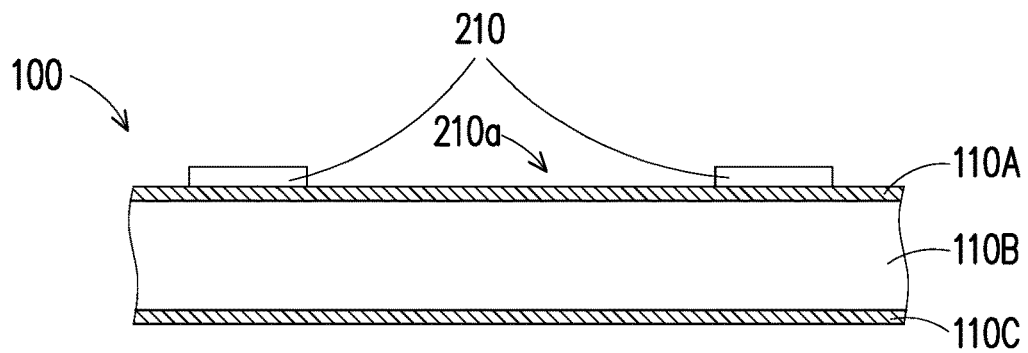
Figure 1C:
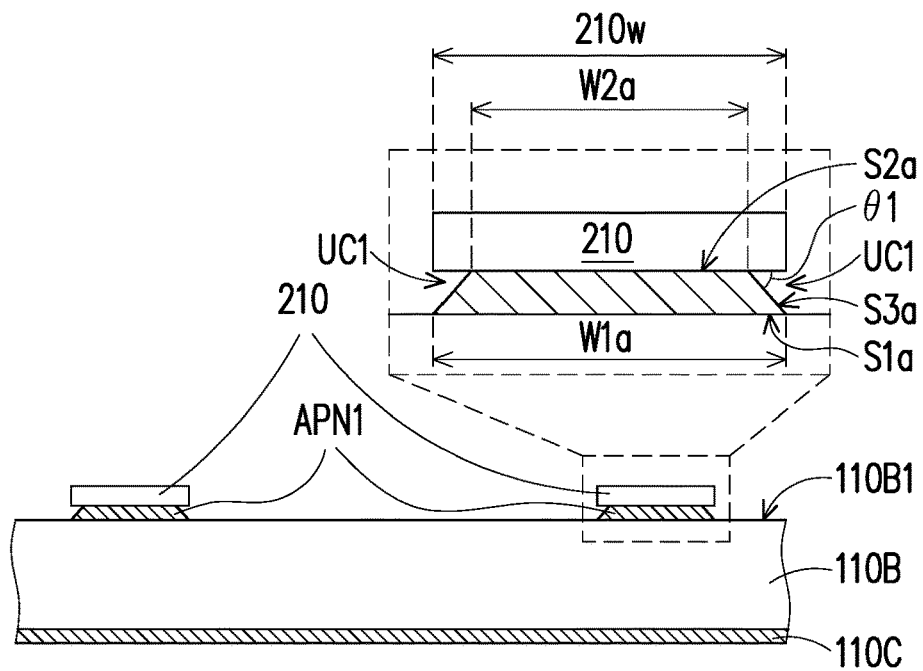
Figure 1D:
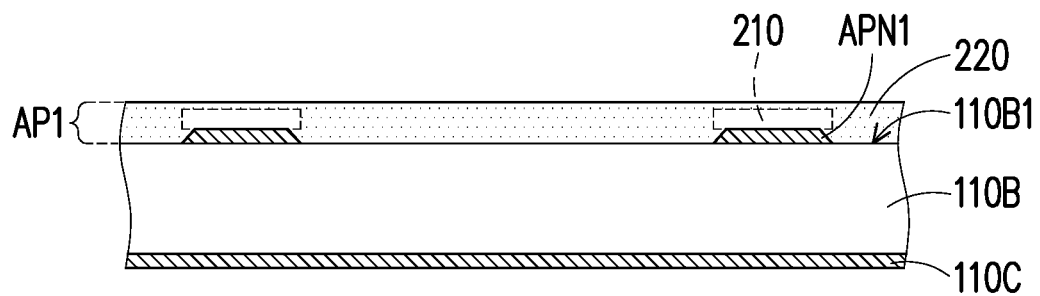
Figure 1E:
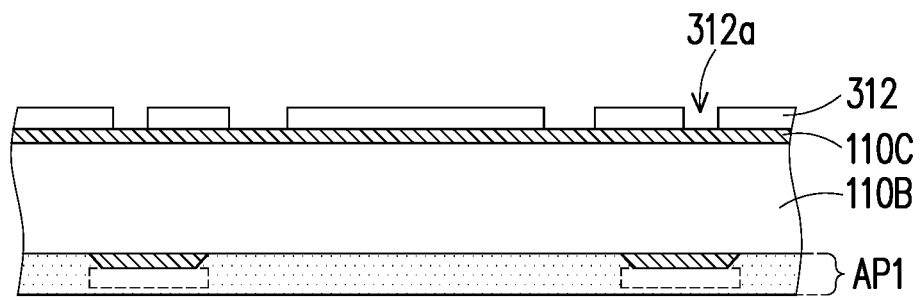
Figure 1F:
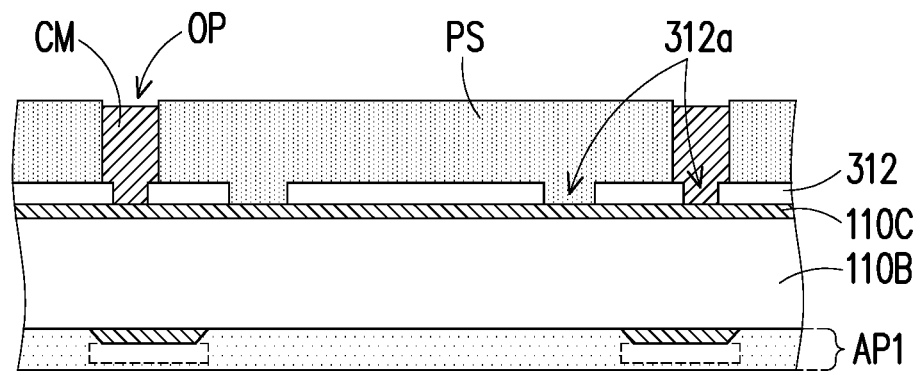
Figure 1G:
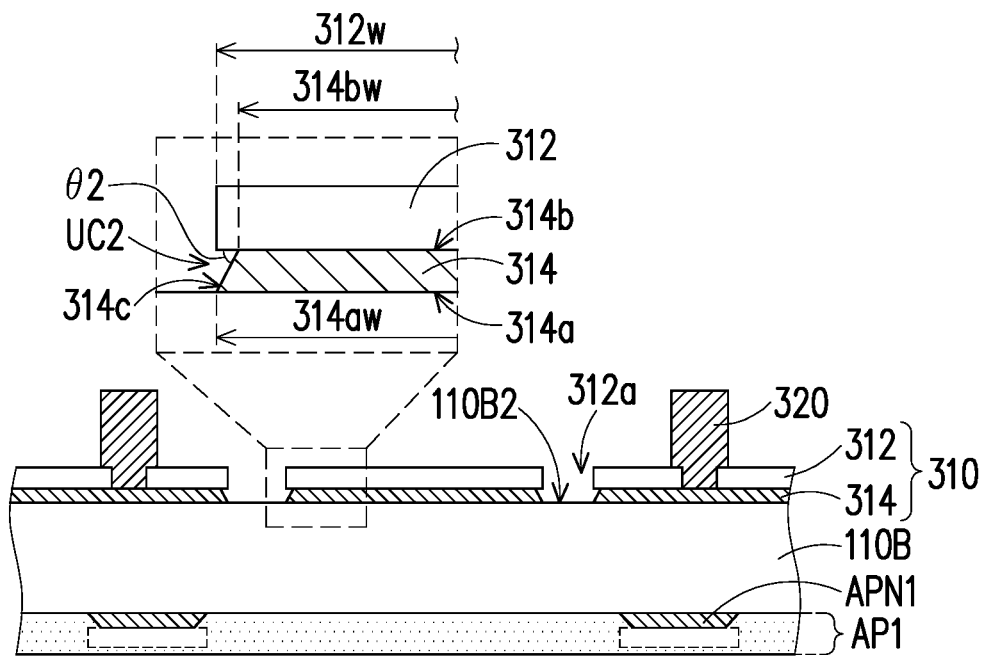
Figure 1H:
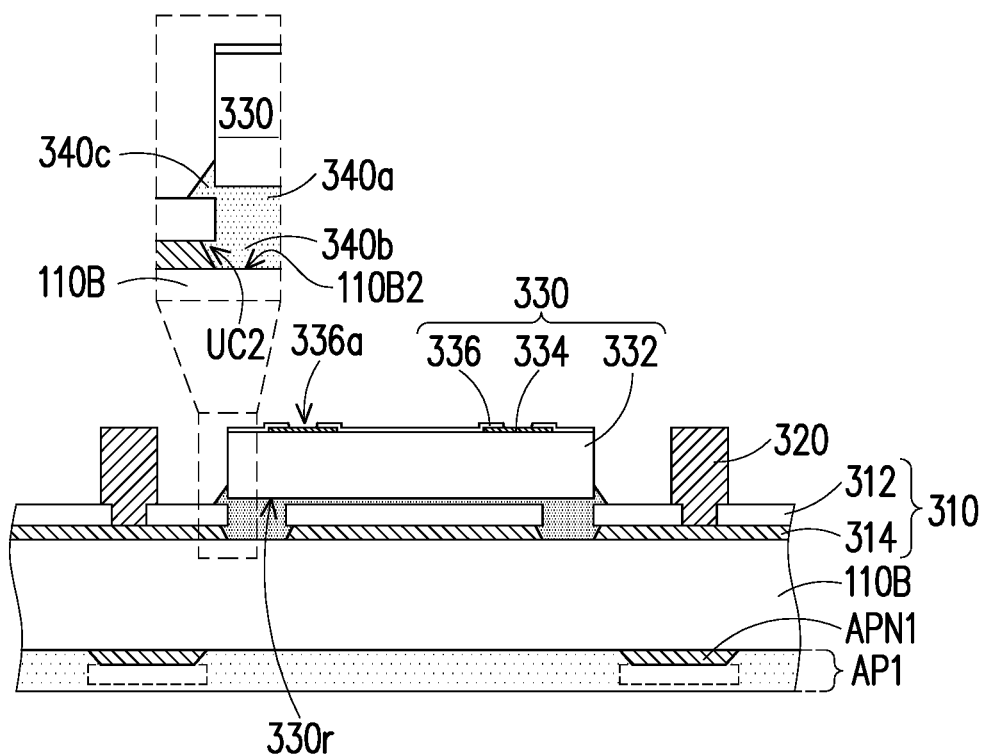
Figure 1I:
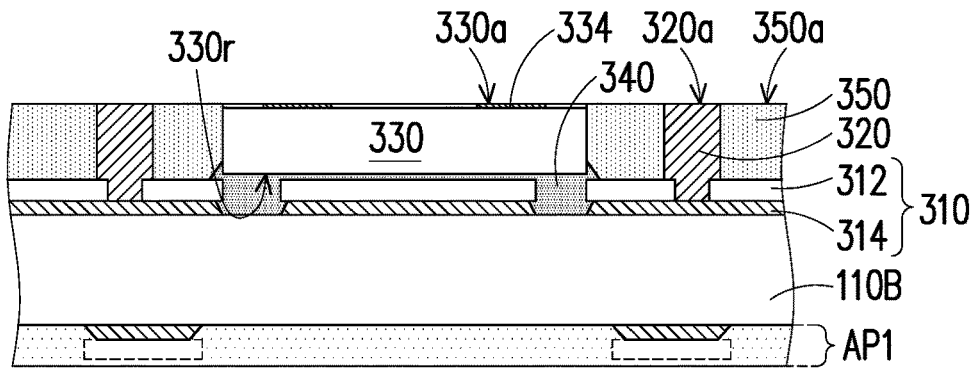
Figure 1J:
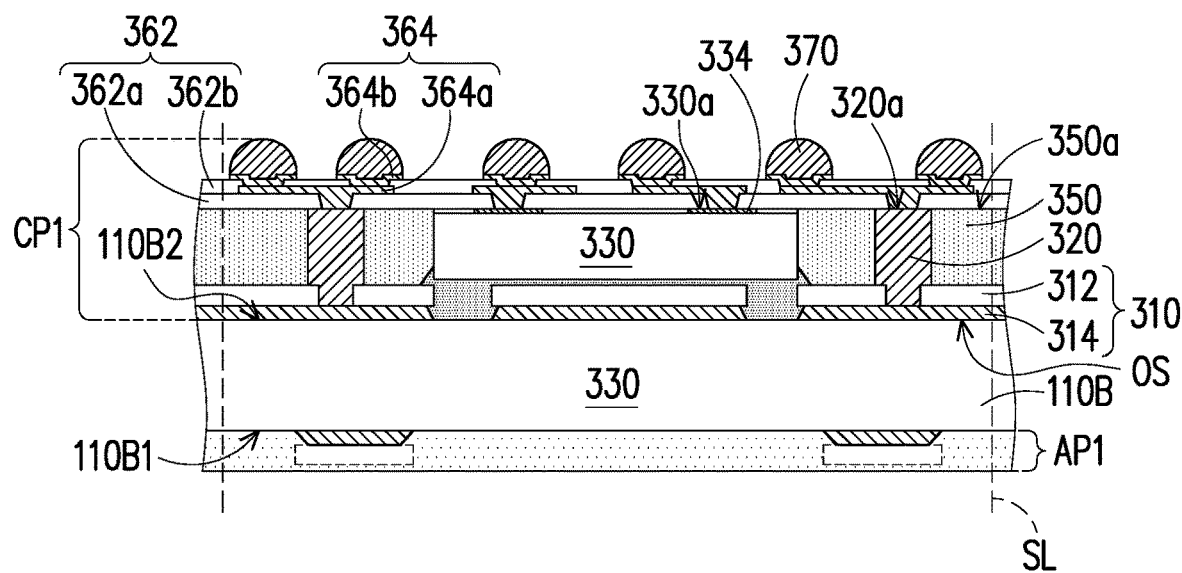
Figure 1K:
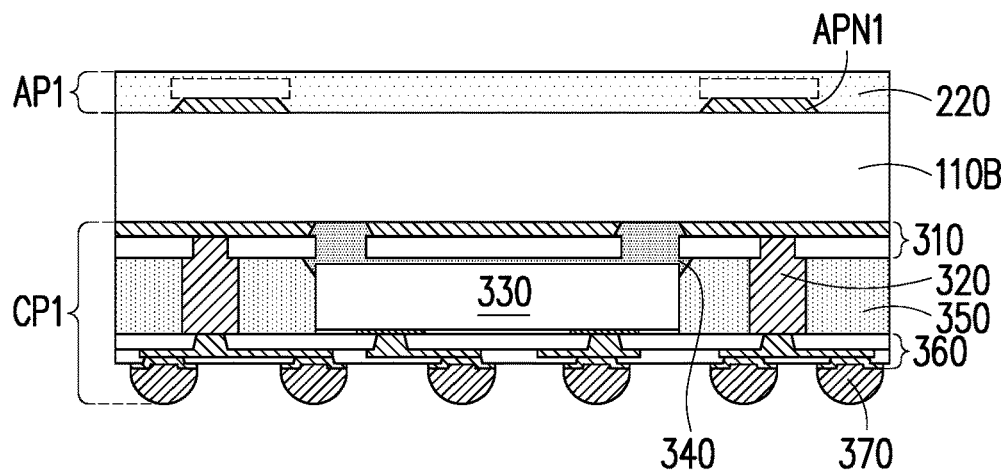
Figure 2A:
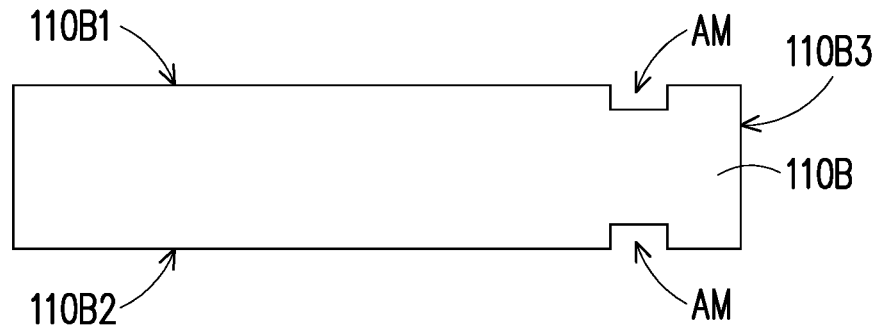
FIG. 2A is a schematic cross-sectional view of a periphery region of a core dielectric layer in accordance with some embodiments of the disclosure.
Figure 2B:
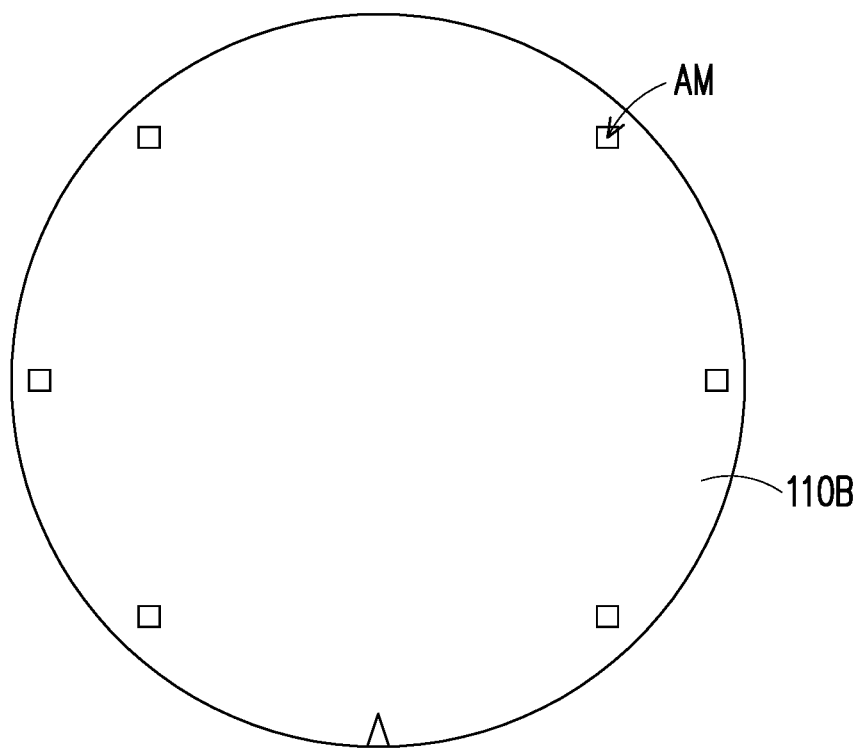
FIG. 2B is a schematic top view of a core dielectric layer in accordance with some embodiments of the disclosure.
Figure 3:
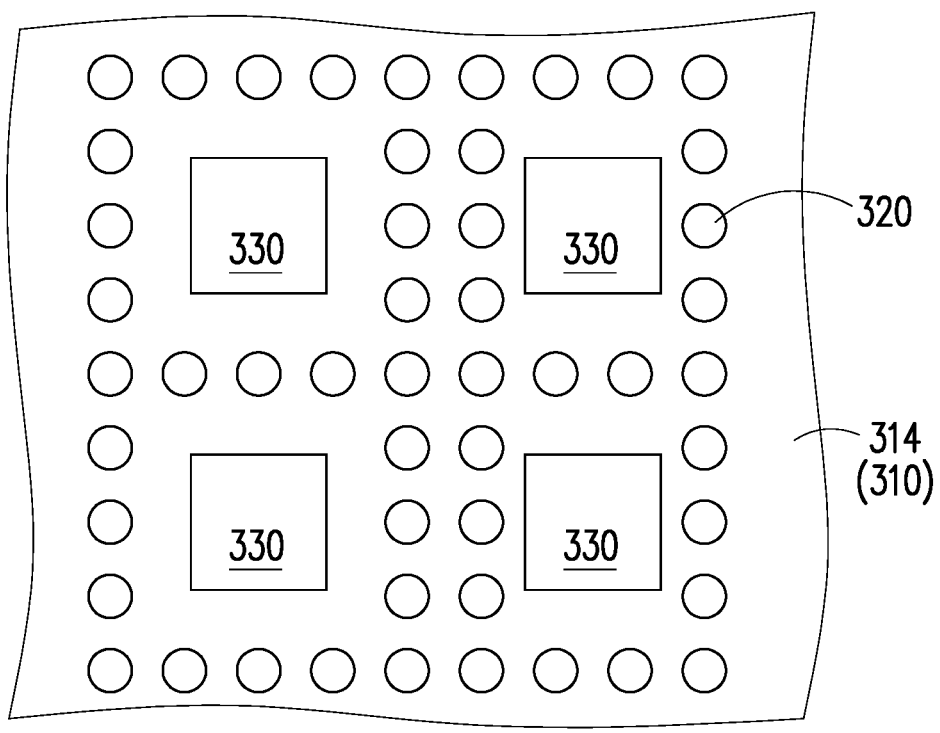
FIG. 3 is a schematic top view of a semiconductor chip and a conductive element in accordance with some embodiments of the disclosure.
Figure 4:
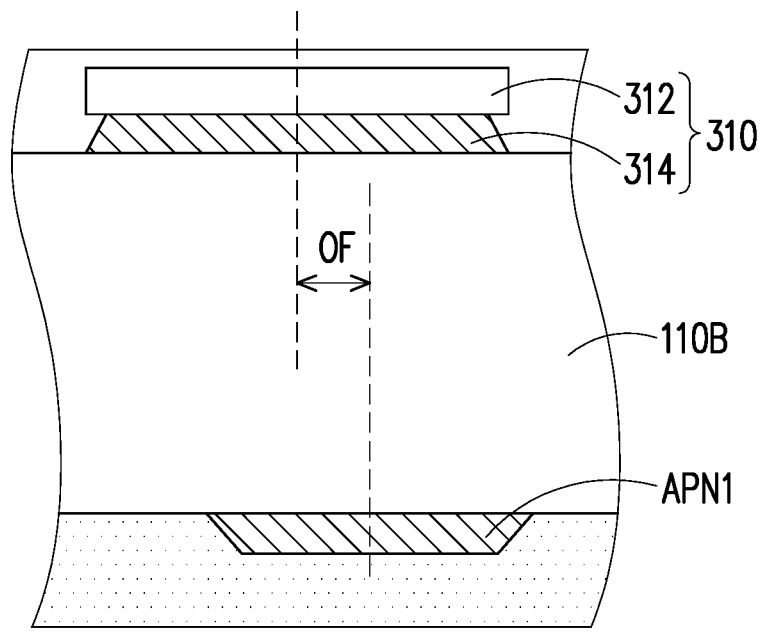
FIG. 4 is an enlarged, schematic cross-sectional view of a core dielectric layer, an antenna pattern and a circuit pattern of a chip package in accordance with some embodiments of the disclosure.

FIG. 1A to FIG. 1K are schematic cross-sectional views of various stages in a manufacturing method of an electronic device in accordance with some embodiments of the disclosure, FIG. 2A is a schematic cross-sectional view of a periphery region of a core dielectric layer in accordance with some embodiments of the disclosure, FIG. 2B is a schematic top view of a core dielectric layer in accordance with some embodiments of the disclosure, FIG. 3 is a schematic top view of a semiconductor chip and a conductive element in accordance with some embodiments of the disclosure, and FIG. 4 is an enlarged, schematic cross-sectional view of a core dielectric layer, an antenna pattern and a circuit pattern of a chip package in accordance with some embodiments of the disclosure.

Referring to FIG. 1A, FIG. 2A and FIG. 2B, a composite structure 100 is provided. For example, the composite structure 100 includes a first conductive layer 110A, a core dielectric layer 110B, and a second conductive layer 110C. The core dielectric layer 110B may include a first surface 110B1, a second surface 110B2 opposite to the first surface 110B1, and a sidewall 110B3 connected to the first surface 110B1 and the second surface 110B2. The first conductive layer 110A and the second conductive layer 110C may be formed on the first surface 110B1 and the second surface 110B2, respectively.

In some embodiments, the core dielectric layer 110B may serve as a signal transmission media. For example, the core dielectric layer 110B is characterized by low dissipation factor (Df) and/or low permittivity (Dk) properties. The core dielectric layer 110B may include polymeric materials, such as polytetrafluoroethylene (PTFE), polyurethane, porous dielectric materials, a combination thereof, or other suitable electrical insulating materials. The coefficients of thermal expansion (CTE) of the core dielectric layer 110B may depend on the material that is selected. Since the warpage control is an important factor for the process window, in some embodiments, the core dielectric layer 110B having an optimized CTE may be configured to control package warpage and stress levels. The thickness of the core dielectric layer 110B can be optimized for different applications. Depending on the frequency range of the high-speed applications, the thickness and suitable materials of the core dielectric layer 110B may be selected based on the required electrical properties. In some embodiments, the core dielectric layer 110B is rigid enough to serve as a dielectric carrier which can withstand the subsequent processes and support structures formed thereon. In other words, the subsequent processes may directly perform on the core dielectric layer 110B, thereby eliminating the manufacturing cost of temporary carrier and simplifying the manufacturing steps.

In some embodiments, the first conductive layer 110A and the second conductive layer 110C are in direct and physical contact with the two opposite surfaces (e.g., 110B1 and 110B2) of the core dielectric layer 110B. The first conductive layer 110A and the second conductive layer 110C may be made of the same or similar conductive materials, such as copper, gold, silver, aluminum, zinc, tin, lead, combinations thereof, alloys thereof, or the like. In some embodiments, the first conductive layer 110A and the second conductive layer 110C may be formed without deposition of seed layers (e.g., Ti/Cu layer) between the first conductive layer 110A and the core dielectric layer 110B, and between the second conductive layer 110C and the core dielectric layer 110B. For example, the first conductive layer 110A and the second conductive layer 110C are formed by laminating conductive foils on opposing sides of the core dielectric layer 110B. Other suitable deposition methods (e.g., sputtering, plating, or the like) for forming conductive layers may be used.

With continued reference to FIG. 1A, FIG. 2A and FIG. 2B, in some embodiments, the composite structure 100 is provided at the wafer level. The composite structure 100 may be provided at different levels (e.g., panel level, chip level, strip level, etc.) depending on the requirement of processing operations. In some embodiments, the core dielectric layer 110B includes an alignment mark AM allowing higher precision in aligning subsequent lithographic and/or etching processes between layers. For example, the alignment mark AM may be formed or provided at the periphery (e.g., close to the sidewall 110B3) of the wafer-leveled core dielectric layer 110B. In alternative embodiments, the alignment mark AM may be provided at the corner and/or center of the core dielectric layer 110B. The alignment mark AM may be grooves formed on at least one surface (e.g., 110B1, 110B2) of the core dielectric layer 110B. In some embodiments, the alignment mark AM is provided as the dual-sided alignment mark for accurately positioning the patterns formed on the first surface 110B1 and the patterns formed on the second surface 110B2 with each other. For example, the alignment mark AM includes symmetrical blind vias formed on the first surface 110B1 and the second surface 110B2 for high dimension and location accuracy of the subsequent-formed patterns so as to achieve low transmission loss. The core dielectric layer 110B including multiple alignment marks AM may result in accurate and improved alignment capability. It should be noted that the alignment mark AM in FIG. 2A and FIG. 2B merely serve as exemplary illustrations, and the alignment mark AM may be formed or provided having any suitable number, size, shape, location, and/or arrangement on the core dielectric layer 110B depending on the requirement of processing operations.

Referring to FIG. 1B, a patterned mask 210 is formed on the first conductive layer 110A. In some embodiments, a dielectric material may be deposited, e.g., by spin-coating, onto the first conductive layer 110A, and then patterned by lithography (i.e., exposure and development processes) to form at least one opening 210a therein, thereby forming the patterned mask 210. The opening 210a of the patterned mask 210 exposes at least a portion of the first conductive layer 110A. In alternative embodiments, the patterned mask 210 is formed by laminating, or any other suitable processes. The patterned mask 210 overlying the first conductive layer 110A may include electrically insulating materials, such as polybenzoxazole (PBO), polyimide (PI), benzocyclobutene (BCB), or other suitable dielectric materials.

Referring to FIG. 1C, at least a portion of the first conductive layer 110A is removed to form an antenna pattern APN1. For example, portions of the first conductive layer 110A exposed by the openings 210a of the patterned mask 210 are removed so that portions of the first surface 110B1 of the core dielectric layer 110B are exposed after a removal process. In some embodiments, the removal process is performed by etching (e.g., dry etching or wet etching). The removal process may include laterally removing the first conductive layer 110A to form an undercut UC1 adjacent to the patterned mask 210. For example, a wet etching process selective to the materials of the first conductive layer 110A is employed to form the antenna pattern APN1 with the undercut UC1. The extent of the undercut UC1 produced may vary from process to process. In some embodiments, the antenna pattern APN1 may include at least one first surface S1a, at least one second surface S2a opposite to the first surface S1a, and at least one sidewall S3a connected to the first surface S1a and the second surface S2a. The first surfaces S1a may be in physical contact with the first surface 110B1 of the core dielectric layer 110B, and the second surfaces S2a may be in physical contact with the patterned mask 210.

In some embodiments, the antenna pattern APN1 is tapered with the first surfaces S1a having widths W1a greater than widths W2a of the second surfaces S2a. The sidewalls S3a may be slanted (i.e. undercut UC1). For example, the sidewall interior angle θ1 of the intersection with the sidewalls S3a and the patterned mask 210 may be an acute angle. In some embodiments, the sidewall interior angle θ1 is in the range of from about 15 degrees to about 75 degrees. With different conditions used in the removal processes of the first conductive layer 110A, the sidewall interior angle θ1 may be right angle or obtuse angle. In some embodiments, widths 210W of the patterned mask 210 are greater than the widths W2a of the second surfaces S2a of the corresponding antenna pattern APN1. The widths 210W of the patterned mask 210 may be substantially equal to or slightly greater than the widths W1a of the first surfaces S1a of the corresponding antenna pattern APN1. In some alternative embodiments, after forming the antenna pattern APN1, the patterned mask 210 may be removed from the antenna pattern APN1. Accordingly, the patterned mask 210 in the following figures is illustrated as dashed to indicate it may or may not be present.

Referring to FIG. 1D, a protection layer 220 may be formed over the first surface 110B1 of the core dielectric layer 110B to encapsulate the antenna pattern APN1. The protection layer 220 may also encapsulate the patterned mask 210 to provide a degree of protection for the underlying structures and prevent oxidation. The protection layer 220 may be a PBO layer, a PI layer, or other suitable polymers. In some alternative embodiments, the protection layer 220 is made of inorganic materials. A suitable fabrication technique may be performed to form the protection layer 220, such as spin-coating, lamination, deposition (e.g., physical vapor deposition (PVD), chemical vapor deposition (CVD), atomic layer deposition (ALD)), or the like. The antenna pattern APN1 and the overlying structures (e.g., the patterned mask 210, protection layer 220) may be collectively viewed as an antenna package AP1. In some embodiments, the formation of protection layer 220 is conducted at the wafer level to cover the wafer-level core dielectric layer 110B so that after the subsequent singulation process, the singulated sidewalls of the antenna package AP1 may be substantially aligned with the singulated sidewalls of the core dielectric layer 110B. In alternative embodiments, the protection layer 220 is formed as a plurality of blocks (not shown) on the core dielectric layer 110B to cover the antenna pattern APN1 and expose portions of the first surface 110B1 of the core dielectric layer 110B. For example, in a top view (not shown), the block shapes of the protection layer 220 may be round or any suitable polygonal shape.

Referring to FIG. 1E, after forming the antenna package APE a first patterned dielectric layer 312 is formed over the second conductive layer 110C. For example, after forming the antenna package APE the structure is overturned (e.g., flipped upside down) for performing processes on the second conductive layer 110C. In some embodiments, the protection layer 220 of the antenna package AP1 and/or the core dielectric layer 110B may be rigid enough to provide mechanical support during subsequent processing. In some embodiments, a first patterned dielectric layer 312 including a predetermined pattern is formed by spin-coating of a dielectric material, baking of the dielectric material layer, and then conducting a lithographic process. In alternative embodiments, lamination or other deposition processes can be performed to form the first patterned dielectric layer 312. The first patterned dielectric layer 312 may be made of a material different from the material of the core dielectric layer 110B. For example, a material of the first patterned dielectric layer 312 may include electrically insulating materials, such as PBO, PI, BCB, or other suitable materials. The first patterned dielectric layer 312 may have a plurality of openings 312a exposing portions of the underlying second conductive layer 110C.

Referring to FIG. 1F, a patterned sacrificial layer PS having at least one opening OP may be formed over the first patterned dielectric layer 312. For example, the openings OP of the patterned sacrificial layer PS is in communication with some of the openings 312a of the first patterned dielectric layer 312. The patterned sacrificial layer PS may cover some other openings 312a of the first patterned dielectric layer 312. The patterned sacrificial layer PS may be a dry-film polymeric layer, a patternable dielectric layer, or any other suitable layer formed by lamination, deposition, or other suitable process. Subsequently, a conductive material CM (e.g., copper, aluminum, gold, nickel, or the like) is formed in the openings OP of the patterned sacrificial layer PS by electroplating, sputtering, or other suitable deposition process. The conductive material CM is then formed on the second conductive layer 110C which is exposed by the openings 312a corresponding to the openings OP of the patterned sacrificial layer PS. In some embodiments, widths of the openings OP of the patterned sacrificial layer PS are greater than that of the openings 312a of the first patterned dielectric layer 312, and part of the conductive material CM may be also deposited on the first patterned dielectric layer 312.

Referring to FIG. 1G with reference to FIG. 4, conductive elements 320 are formed, and at least a portion of the second conductive layer 110C is removed to form a first circuit pattern 314. For example, after forming the conductive material CM, the patterned sacrificial layer PS is removed using reactive ion etching (RIE), stripping tailored for particular photoresists followed optionally by etching, or other suitable techniques. After the removal of the patterned sacrificial layer PS, the conductive elements 320 are formed in physical contact with the underlying second conductive layer 110C. In some embodiments, after removing the patterned sacrificial layer PS, some of the openings 312a of the first patterned dielectric layer 312 covered by the patterned sacrificial layer PS are exposed. Subsequently, part of the second conductive layer 110C exposed by the openings 312a of the first patterned dielectric layer 312 may be removed using etching (e.g., wet etching, dry etching, plasma etching, or the like), or other suitable removal techniques. In some embodiments, during the removal process of the second conductive layer 110C, the first patterned dielectric layer 312 may serve as a mask for patterning the underlying second conductive layer 110C.

In some embodiments, the second conductive layer 110C is patterned by a wet etching process to form the first circuit pattern 314 with an undercut UC2. The first patterned dielectric layer 312 serving as an etch mask may include a compensational pattern such that etching of the second conductive layer 110C may be moderated, thereby facilitating the formation of the first circuit pattern 314 with desired line widths. The extent of the undercut UC2 formed may vary from process to process. For example, the first circuit pattern 314 include at least one first surface 314a (i.e. third surfaces), at least one second surface 314b (i.e. fourth surfaces) opposite to the first surface 314a, and at least one sidewall 314c connected to the first surface 314a and the second surface 314b. The first surfaces 314a may be in physical contact with the second surface 110B2 of the core dielectric layer 110B, and the second surfaces 314b may be in physical contact with the first patterned dielectric layer 312. Part of the second surfaces 314b of the first circuit pattern 314 may be physically and electrically connected to the conductive elements 320.

In some embodiments, the first circuit pattern 314 is tapered with the first surfaces 314a including widths 314aw greater than widths 314bw of the second surfaces 314b. The sidewalls 314c of the first circuit pattern 314 may be slanted (i.e. undercut UC2). For example, the sidewall interior angle θ2 of the intersection with the sidewalls 314c of the first circuit pattern 314 and the first patterned dielectric layer 312 may be an acute angle. In some embodiments, the sidewall interior angle θ2 is in the range of from about 15 degrees to about 75 degrees. With different conditions used in the removal processes of the second conductive layer 110C, the sidewall interior angle θ2 may be right angle or obtuse angle. In some embodiments, widths 312w of the first patterned dielectric layer 312 are greater than the widths 314bw of the second surfaces 314b of the corresponding first circuit pattern 314. The widths 314bw of the second surfaces 314b may be substantially equal to or slightly greater than the widths 314aw of the first surfaces 314a of the corresponding first circuit pattern 314.

In some embodiments, the first patterned dielectric layer 312 and the first circuit pattern 314 may be collectively viewed as a first redistribution structure 310. After forming the first redistribution structure 310, at least a portion of the second surface 110B2 of the core dielectric layer 110B may be exposed by the first redistribution structure 310. In some embodiments, the first circuit pattern 314 may include feed lines and a ground plane (not shown). For example, the feed lines of the first circuit pattern 314 may be electrically connected to the conductive elements 320 for signal transmission, and the ground plane of the first circuit pattern 314 may be electrically connected to a ground. It should be noted that the numbers of the dielectric layers and/or the circuit pattern(s) of the first redistribution structure 310 are not limited by the illustration presented in FIG. 1G.

When the formation of the first redistribution structure 310, the alignment mark AM (shown in FIG. 2A and FIG. 2B) of the core dielectric layer 110B may be used, thereby aligning the first patterned dielectric layer 312 at a predetermined position. Accordingly, at least a portion of the first conductive layer 110A may be removed to form the first circuit pattern 314 with improved accuracy with respect to the antenna pattern APN1. Due to positioning to the alignment mark AM, the overlay offset OF of the first circuit pattern 314 regarding to the antenna pattern APN1 may be optimized and may satisfy overlay requirements for advanced technologies. For example, the overlay offset OF may be in a range within about 10 μm of a targeted position. In some embodiments, the overlay offset OF between the first circuit pattern 314 and the antenna pattern APN1 is less than about 5 μm.

Referring to FIG. 1H with reference to FIG. 3, a semiconductor chip 330 is disposed on the first redistribution structure 310. In some embodiments, one or more semiconductor chips 330 are picked and placed on the first patterned dielectric layer 312. For example, the semiconductor chips 330 are arranged in an array surrounded by the conductive elements 320 as shown in FIG. 3. It should be appreciated that the illustration of FIG. 3 is schematic and not in scale. For example, the semiconductor chips 330 are arranged in such as the N×N array or N×M arrays (N, M>0, N may or may not be equal to M). The size of the array for the semiconductor chips 330 can be designated and selected based on the demand, and is not limited to the disclosure. The plurality of conductive elements 320 may be classified into groups, and the number of the semiconductor chip 330 may correspond to the number of the groups of the conductive elements 320. In some embodiments, the shapes of the conductive elements 320 in a top view may be round, elliptical, oval, square, rectangular, tetragonal, hexagonal, octagonal, or any suitable polygonal shape. The semiconductor chips 330 may include the same or different types of die/chip(s) selected from digital dies, analog dies or mixed signal dies, application-specific integrated circuit (ASIC) dies, sensor dies, memory dies, or logic dies, or other suitable dies. For example, the semiconductor chips 330 include at least one wireless and RF die.

In some embodiments, the semiconductor chip 330 includes a semiconductor substrate 332, a plurality of conductive pads 334, and a passivation layer 336. In some embodiments, the conductive pads 334 are disposed on an active surface of the semiconductor substrate 332. The passivation layer 336 is formed over the semiconductor substrate 332 and includes contact openings 336a that partially expose the conductive pads 334. The semiconductor substrate 332 may be a silicon substrate including active components (e.g., transistors, or the like) and passive components (e.g., resistors, capacitors, inductors, or the like) formed therein. The conductive pads 334 may be aluminum pads, copper pads, or other suitable metallic pads. The passivation layer 336 may include stacked multi-sublayers, including a silicon oxide layer, a silicon nitride layer, a PI layer, a PBO layer, or a dielectric layer formed by other suitable polymers.

In some embodiments, the semiconductor chip 330 is provided with an attaching layer 340 adhered to a rear surface 330r of the semiconductor chip 330 that is opposite to the active surface. After disposing the semiconductor chip 330, the semiconductor chip 330 is attached to the first redistribution structure 310 through the attaching layer 340. In some embodiments, the attaching layer 340 includes a polymer, thermoplastic material (e.g. epoxy resin, phenol resin, etc.), or other suitable material that functions as an adhesive. The attaching layer 340 may be a die attached film, an adhesive bonding film, or the like. In some embodiments, when disposing the semiconductor chip 330, the attaching layer 340 is subjected to a pressure to enhance the adhesion between the semiconductor chip 330 and the first redistribution structure 310. For example, a force may be exerted on the semiconductor chip 330 so that the attaching layer 340 may be extruded out of the rear surface 330r of the semiconductor chip 330 to extend downwardly into the first redistribution structure 310 and/or climb upwardly to cover the sidewalls of the semiconductor chip 330. In other words, when disposing the semiconductor chip 330, the attaching layer 340 may pass through the first patterned dielectric layer 312 and the first circuit pattern 314 to be in contact with the core dielectric layer 110B. For example, the attaching layer 340 includes a first portion 340a between the semiconductor chip 330 and the first redistribution structure 310, and a second portion 340b (i.e. protruding portion) embedded in the first redistribution structure 310 to be in physical contact with the second surface 110B2 of the core dielectric layer 110B. The undercut UC2 of the first circuit pattern 314 may be filled with the second portion 340b of the attaching layer 340. The second portion 340b of the attaching layer 340 may be in physical contact with the first patterned dielectric layer 312 and the first circuit pattern 314. In some embodiments, the attaching layer 340 further includes a third portion 340c covering part of the bottom sidewall of the semiconductor chip 330.

Referring to FIG. 1I, an insulating encapsulation 350 is formed over the first redistribution structure 310 to wrap around the semiconductor chip 330, the attaching layer 340, and the conductive elements 320. In some embodiments, the semiconductor chip 330 and the conductive elements 320 are over-molded to be embedded in an insulating material (not shown). Subsequently, the insulating material is thinned until at least the conductive pads 334 of the semiconductor chip 330 and the top surfaces 320a of the conductive elements 320 are accessibly exposed so as to form the insulating encapsulation 350. The insulating material may be thinned by a mechanical grinding process and/or a chemical mechanical polishing (CMP) process, an etching process, or other suitable techniques. The insulating encapsulation 350 may include a molding compound, a molding underfill, an epoxy resin, or the like, and may be formed by a molding process. In some embodiments, during the thinning process, not only the insulating material, but also portions of the semiconductor chip 330 and/or the conductive elements 320 are slightly removed. In some embodiments, the top surface 350a of the insulating encapsulation 350 is substantially coplanar with the top surfaces 320a of the conductive elements 320 and the top surface 330a (e.g., opposite to the rear surface 330r) of the semiconductor chip 330. After forming the insulating encapsulation 350, the sidewalls of the semiconductor chip 330 and the sidewalls of the conductive elements 320 may be laterally encapsulated by the insulating encapsulation 350. In some embodiments, the insulating encapsulation 350 is penetrated by the conductive elements 320, and the conductive elements 320 may be referred to as through insulator vias (TIVs) or integrated fan-out (InFO) vias.

Referring to FIG. 1J, a second redistribution structure 360 and one or more conductive terminals 370 may be formed on the semiconductor chip 330, the conductive elements 320, and the insulating encapsulation 350. In some embodiments, the second redistribution structure 360 includes a second patterned dielectric layer 362 and a second circuit pattern 364. The second patterned dielectric layer 362 may include more than one patterned dielectric layers (e.g., 362a and 362b). The second circuit pattern 364 may include more than one patterned conductive layers (e.g., 364a and 364b) based on the circuit design requirements. A material of the second patterned dielectric layer 362 and a material of the second circuit pattern 364 may be similar to that of the first patterned dielectric layer 312 and that of the first circuit pattern 314, respectively, so the detailed description thereof is omitted herein.

In some embodiments, the second redistribution structure 360 may be formed using at least the following steps. For example, the patterned dielectric layer 362a having openings is formed over the top surface 350a of the insulating encapsulation 350, the top surfaces 320a of the conductive elements 320, and the top surface 330a of the semiconductor chip 330. The openings of the patterned dielectric layer 362a may expose portions of the conductive pads 334 of the semiconductor chip 330 and the top surfaces 320a of the conductive elements 320. Next, a conductive material is formed on the patterned dielectric layer 362a and formed in the openings of the patterned dielectric layer 362a to be in physical contact with the conductive pads 334 of the semiconductor chip 330 and the conductive elements 320. For example, a deposition process (e.g., sputtering, plating, or the like), or other suitable methods, may be used to form the conductive material. Subsequently, portions of the conductive material formed on the patterned dielectric layer 362a are removed to form the patterned conductive layer 364a. Next, the patterned dielectric layer 362b is formed over the patterned dielectric layer 362a to cover the patterned conductive layer 364a. The patterned dielectric layer 362b may have openings exposing at least a portion of patterned conductive layer 364a. Subsequently, the patterned conductive layer 364b is formed on the patterned dielectric layer 362b and formed in the openings of the patterned dielectric layer 362b to be in physical contact with the patterned conductive layer 364a exposed by the patterned dielectric layer 362b. The portions of the conductive material embedded in the patterned dielectric layers (e.g., 362a, 362b) and connected to the conductive elements 320 and the patterned conductive layer 364a may be referred to as conductive vias. The portions of the conductive material formed on the patterned dielectric layers (e.g., 362a, 362b) may include conductive lines, connection pads, or other conductive features. In some embodiments, a portion of the patterned conductive layer 364b may be referred to as under-ball metallurgy (UBM) pattern for the subsequent ball-mounting process. In some alternative embodiments, the patterned conductive layer 364b includes connection pads (not shown) for bonding electronic components (e.g., capacitors, resistors, inductors, etc.).

In some embodiments, given the placements in the structure, the first redistribution structure 310 electrically coupled to the semiconductor chip 330 may be referred to as a backside redistribution structure, and the second redistribution structure 360 electrically connected to the semiconductor chip 330 may be referred to as a front-side redistribution structure. In some embodiments, since the first redistribution structure 310 and the second redistribution structure 360 reroute the electrical signal of the semiconductor chip 330 and reroute outside the span of the semiconductor chip 330, the first redistribution structure 310 and the second redistribution structure 360 may be referred to as fan-out redistribution structures. In some embodiments, the signal output from the semiconductor chip 330 may be transmitted through portions of the second circuit pattern 364, the conductive elements 320, and the first circuit pattern 314 in sequential order, and the portions of the second circuit pattern 364, the conductive elements 320, and the first circuit pattern 314 may be collectively referred to as a feed line. In some alternative embodiments, additional TIVs (not shown) may be formed aside the conductive elements 320 to electrically connect the second circuit pattern 364 of the second redistribution structure 360, and these additional TIVs may be arranged to form dipole antennas.

Continued to FIG. 1J, the conductive terminals 370 may be formed on patterned conductive layer 364b of the second circuit pattern 364 exposed by the patterned dielectric layer 362b of the second patterned dielectric layer 362 to electrically connect the semiconductor chip 330 through the second redistribution structure 360. In some embodiments, the conductive terminals 370 are made of conductive materials with low resistivity, such as Sn, Pb, Ag, Cu, Ni, Bi, or an alloy thereof. The conductive terminals 370 may include solder balls, ball grid array (BGA) balls, or other suitable conductive materials formed in other shapes. For example, the conductive terminals 370 may be disposed on the UBM pattern of the patterned conductive layer 364b by a ball placement process and/or a reflow process. It should be noted that the number of the conductive terminals 370 is not limited by the illustration presented in FIG. 1J. In some embodiments, the structures formed on the second surface 110B2 of the core dielectric layer 110B may be viewed as a chip package CP1. The core dielectric layer 110B may be sandwiched between the antenna package AP1 and the chip package CP1, and the first circuit pattern 314 of the first redistribution structure 310 may be located at an outermost side OS of the chip package CP1 to be in direct contact with the core dielectric layer 110B. After forming the chip package CP1, a singulation process may be performed to cut the chip package CP1, the core dielectric layer 110B, and the antenna package AP1 along a scribe line SL.

Referring to FIG. 1K, after performing a singulation process, the structures including the chip package CP1, the core dielectric layer 110B, and the antenna package AP1 are cut into a plurality of electronic devices 10. Since the formations of the first circuit pattern 314 and the antenna pattern APN1 are directly performed on the core dielectric layer 110B, high process accuracy may be preserved. In some embodiments, the electronic device 10 may be further mounted with an additional chip package, a package substrate, a printed circuit board, or other electronic devices, to form a package-on-package (PoP) structure through the conductive terminals 370 and/or other additional conductive connectors based on the demand.

Figure 5A:
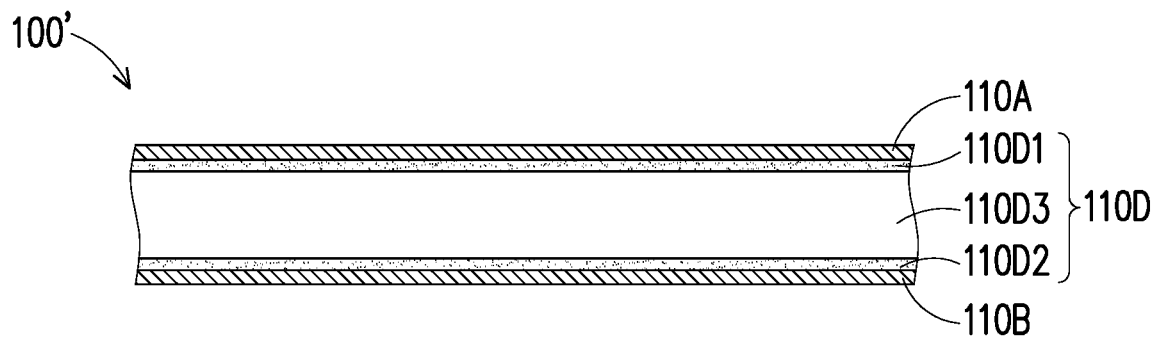
FIG. 5A to FIG. 5B are schematic cross-sectional views of various stages in a manufacturing method of an electronic device in accordance with some embodiments of the disclosure.
Figure 5B:
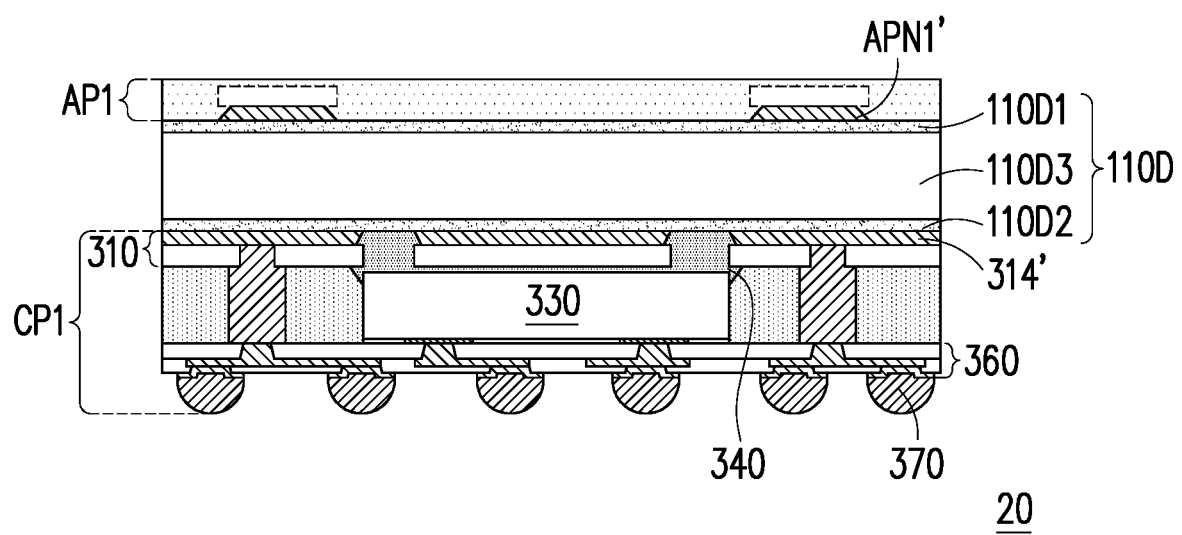

FIG. 5A to FIG. 5B are schematic cross-sectional views of various stages in a manufacturing method of an electronic device in accordance with some embodiments of the disclosure. The identical or similar numbers refer to the identical or similar elements throughout the drawings, and detail thereof is not repeated. Referring to FIG. 5A, in some embodiments, the core dielectric layer 110D of the composite structure 100' includes multiple sublayers. For example, the core dielectric layer 110D includes at least one first sub-layer (e.g., 110D1, 110D2) and a second sub-layer 110D3 connected to the first sub-layer. For example, the core dielectric layer 110D includes the first sub-layers 110D1 and 110D2 respectively connected to the first conductive layer 110A and the second conductive layer 110C. The second sub-layer 110D3 may be sandwiched between the first sub-layers 110D1 and 110D2. In some embodiments, the second sub-layer 110D3 is thicker than the first sub-layers 110D1 and 110D2. In some embodiments, the first sub-layers 110D1 and 110D2 may improve the adhesion between layers which are in physical contact with the first sub-layers 110D1 and 110D2. For example, the second sub-layer 110D3 has the adhesion lower than the adhesion of the first sub-layers 110D1 and 110D2. A material of the first sub-layer (e.g., 110D1, 110D2) may include polyurethane, epoxy, combinations thereof, or the like. The core dielectric layer 110D and the first conductive layer 110A and/or the second conductive layer 110C may be adhered to one another through the first sub-layer (e.g., 110D1, 110D2). It should be noted that FIG. 5A merely serves as an illustrative example, the core dielectric layer of the composite structure may include more or fewer sublayers, and the disclosure is not limited thereto. The composite structure 100' can be employed for subsequent processing steps similar to the descriptions in FIG. 1B to FIG. 1J, and the descriptions are not repeated for brevity.

Referring to FIG. 5B, an electronic device 20 is provided. The first circuit pattern 314' of the first redistribution structure 310 formed by the first conductive layer 110A may be located at the outermost side of the chip package CP1 and directly connected to the first sub-layer 110D1 of the core dielectric layer 110D. The antenna pattern APN1' formed by the second conductive layer 110C may be located at the outermost side of the antenna package AP1 and directly connected to the first sub-layer 110D2 of the core dielectric layer 110D. In some embodiments, the antenna pattern APN1' are arranged in the form of arrays on the core dielectric layer 110D within the intended location of the semiconductor chip 330.

Figure 6A:
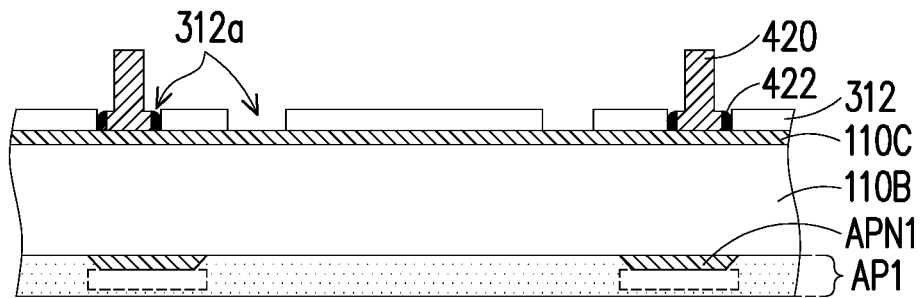
FIG. 6A to FIG. 6C are schematic cross-sectional views of various stages in a manufacturing method of an electronic device in accordance with some embodiments of the disclosure.
Figure 6B:
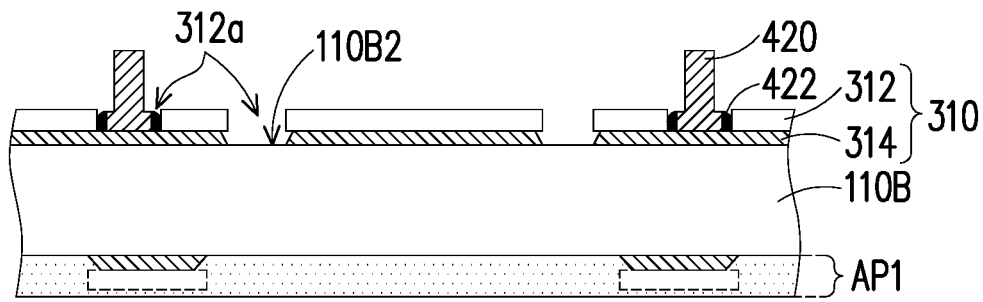
Figure 6C:
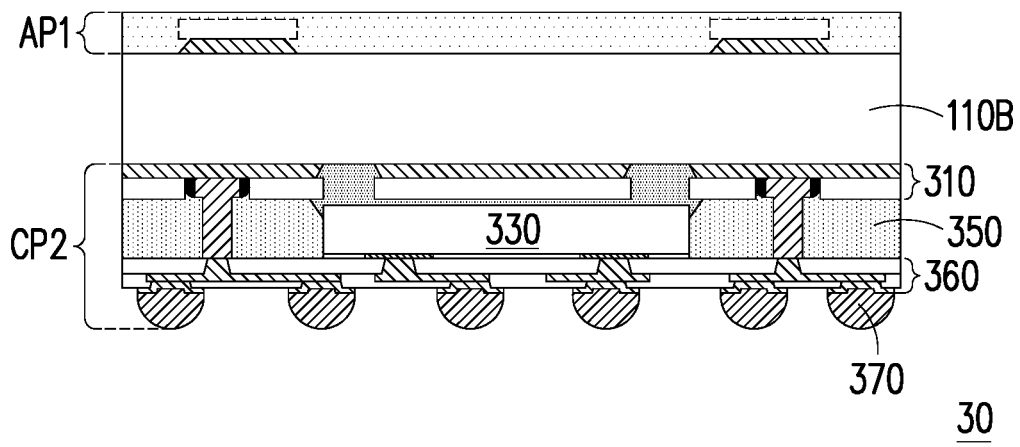

FIG. 6A to FIG. 6C are schematic cross-sectional views of various stages in a manufacturing method of an electronic device in accordance with some embodiments of the disclosure. The preceding processes may be similar to the descriptions in FIG. 1A to FIG. 1E, and the detailed descriptions are omitted for brevity. Referring to FIG. 6A, after forming the first patterned dielectric layer 312 over the second conductive layer 110C, at least one conductive element 420 may be bonded to the second conductive layer 110C within one of the openings 312a of the first patterned dielectric layer 312. The conductive element 420 may not be in direct contact with the first patterned dielectric layer 312. For example, the conductive element 420 is mounted on the second conductive layer 110C through a conductive joint 422.

In some embodiments, the conductive element 420 is pre-formed with a conductive material thereon. For example, the conductive element 420 may be formed as T-shaped post with the bottom section covered by the solder material. In alternative embodiments, the conductive element 420 is pre-formed, and the solder material may be dispensed on the predetermined position of the second conductive layer 110C. The conductive material may include a high-Pb material, a Sn-based solder, a lead-free solder, or other suitable conductive materials. After disposing the conductive element 420 on the second conductive layer 110C, a soldering process and an optional reflowing process may be performed to form the conductive joint 422. In some embodiments, the conductive joint 422 may enhance the adhesion between the conductive element 420 and the second conductive layer 110C. In some embodiments, an inter-metallic compound layer (not shown) may be formed at interfaces between the conductive joint 422 and the second conductive layer 110C and/or the conductive element 420. In alternative embodiments, the conductive joint 422 is omitted, and the conductive element 420 may be connected to the second conductive layer 110C through direct metal-to-metal bonding.

Referring to FIG. 6B, after forming the conductive elements 420, the second conductive layer 110C is patterned using the first patterned dielectric layer 312 as a mask so as to form the first circuit pattern 314. The removal process of the second conductive layer 110C may be similar to the descriptions in FIG. 1G, and the detail is omitted for brevity. After forming the first circuit pattern 314 of the first redistribution structure 310, the subsequent steps (e.g., the configuration of semiconductor chip 330 with attaching layer 340, the formations of insulating encapsulation 350, second redistribution structure 360, conductive terminal 370, and the singulation) may be similar to the descriptions in FIG. 1H to FIG. 1J, so the detailed descriptions are not repeated herein.

Referring to FIG. 6C, after performing a singulation process, an electronic device 30 is formed. For example, a chip package CP2 of the electronic device 30 includes the conductive element 420 embedded in the insulating encapsulation 350. The conductive element 420 may be attached to the first circuit pattern 314 through the conductive joint 422 to electrically couple to the semiconductor chip 330, thereby achieving process simplicity and reducing the manufacturing cost.

Figure 7A:
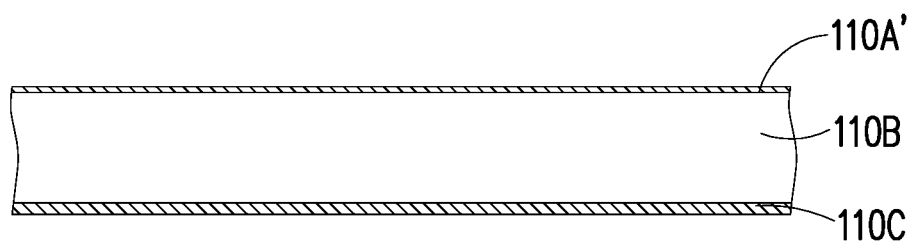
FIG. 7A to FIG. 7I are schematic cross-sectional views of various stages in a manufacturing method of an electronic device in accordance with some embodiments of the disclosure.

FIG. 7A to FIG. 7I are schematic cross-sectional views of various stages in a manufacturing method of an electronic device in accordance with some embodiments of the disclosure. Referring to FIG. 7A, the first conductive layer 110A of the composite structure 100 may be thinned to form a thinned first conductive layer 110A'. For example, an etching process, or other suitable techniques, may be employed to reduce a thickness of the first conductive layer 110A to a desired thickness. A cleaning process is optionally performed on the surface of the thinned first conductive layer 110A' before subsequent processing.

Figure 7B:
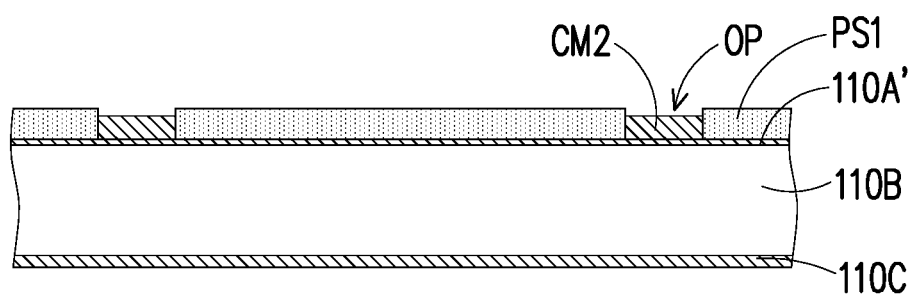
Figure 7C:
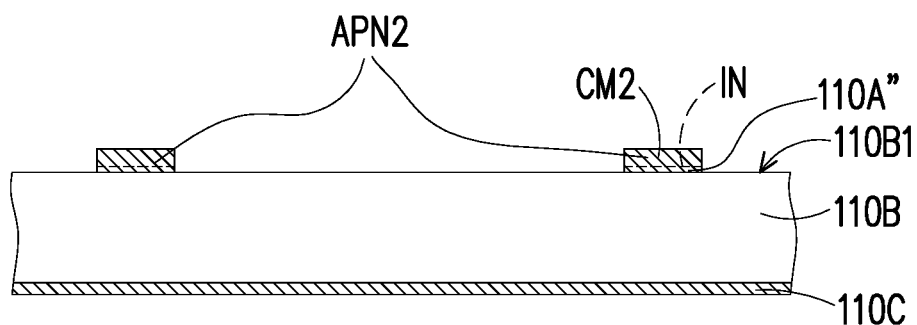

Referring to FIG. 7B and FIG. 7C, a patterned sacrificial layer PS1 having at least one opening OP2 may be formed over the thinned first conductive layer 110A', and a conductive material CM2 (e.g., a metal, like copper, gold, tungsten, aluminum, etc.) may be formed within the opening OP2 of the patterned sacrificial layer PS1 to cover the thinned first conductive layer 110A'. For example, the conductive material CM2 may be formed by plating, such as electroplating or electroless plating, or the like. Other methods, such as sputtering, evaporation, or other suitable deposition process, may be employed. Next, the patterned sacrificial layer PS1 may be removed using the same method or similar methods to the patterned sacrificial layer PS described in FIG. 1G. Subsequently, portions of the thinned first conductive layer 110A' exposed by the conductive material CM2 may be removed to form a treated first conductive layer 110A" using an acceptable etching process, such as by wet or dry etching. The treated first conductive layer 110A" may expose the first surface 110B1 of the core dielectric layer 110B. The remaining portions of the treated first conductive layer 110A" and the conductive material CM2 form an antenna pattern APN2 as show in FIG. 7C. In some embodiments, the antenna pattern APN2 formed by plating may satisfy high-speed and high-frequency requirements for advanced technologies. In some embodiments, the antenna pattern APN2 includes an interface IN between the conductive material CM2 and the treated first conductive layer 110A". In some alternative embodiments, the interface IN between the conductive material CM2 and the thinned first conductive layer 110A' may not be present. Accordingly, the interface IN in FIG. 7C is illustrated as dashed to indicate it may or may not be present, and the interface IN is omitted in the illustration presented in the following figures for simplicity.

Figure 7D:
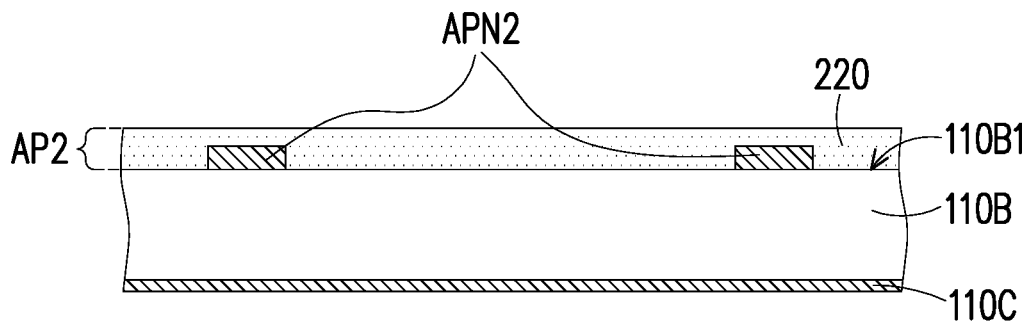
Figure 7E:
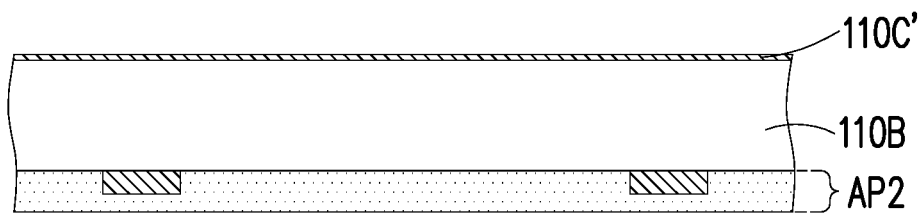

Referring to FIG. 7D and FIG. 7E, the protection layer 220 may be formed over the first surface 110B1 of the core dielectric layer 110B to encapsulate the antenna pattern APN2 so as to form an antenna package AP2. The forming process of the protection layer 220 may be similar to the descriptions in FIG. 1D, and the detailed descriptions are not repeated herein. Subsequently, the structure may be overturned (e.g., flipped upside down), and the second conductive layer 110C may be thinned to form a thinned second conductive layer 110C' through an etching process, or other suitable techniques. For example, the second conductive layer 110C is thinned to a desired thickness in the range of from about 3 μm to about 12 μm.

Figure 7F:
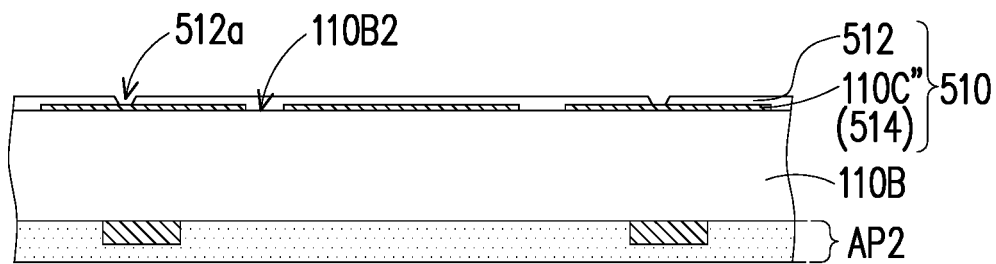

Referring to FIG. 7F, a first redistribution structure 510 may be formed over the second surface 110B2 of the core dielectric layer 110B. For example, the first redistribution structure 510 includes at least one first patterned dielectric layer 512 and at least one of first circuit pattern 514. In some embodiments, after thinning the second conductive layer 110C, at least a portion of the thinned second conductive layer 110C' is removed to form the first circuit pattern 514. For example, a patterned sacrificial layer (not shown) having a predetermined pattern is formed over the thinned second conductive layer 110C', and may expose at least a portion of the thinned second conductive layer 110C'. Next, the portion of the thinned second conductive layer 110C' exposed by the patterned sacrificial layer is removed using an acceptable etching process, or other suitable techniques. Subsequently, the patterned sacrificial layer is removed, and then a treated second conductive layer 110C'" is remained on the core dielectric layer 110B to form the first circuit pattern 514. The first circuit pattern 514 may expose at least a portion of the second surface 110B2 of the core dielectric layer 110B.

In some embodiments, after forming the first circuit pattern 514, the first patterned dielectric layer 512 including at least one opening 512a is formed over the first circuit pattern 514. For example, a dielectric material (e.g., PI, PBO, BCB, or the like) is formed over the first circuit pattern 514 using CVD, PVD, ALD, a spin-on coating process, a combination thereof, or the like. Subsequently, the dielectric material may be patterned to form the first patterned dielectric layer 512 with openings 512a by developing, etching, laser drilling process, or other suitable process to expose at least a portion of the first circuit pattern 514. In some embodiments, a portion of the first patterned dielectric layer 512 may be formed in the first circuit pattern 514 to be in physical contact with the second surface 110B2 of the core dielectric layer 110B. In some other embodiments, after forming the first patterned dielectric layer 512, a patterned conductive layer (not shown) may be formed over the first patterned dielectric layer 512 and in the openings 512a of the first patterned dielectric layer 512. Next, a patterned dielectric layer (not shown) may be formed over the patterned conductive layer so as to form a multi-layered redistribution structure 510 as required by the circuit design. The numbers of the patterned conductive layer and the patterned dielectric layer can be selected based on demand, which are not limited in the disclosure.

Figure 7G:
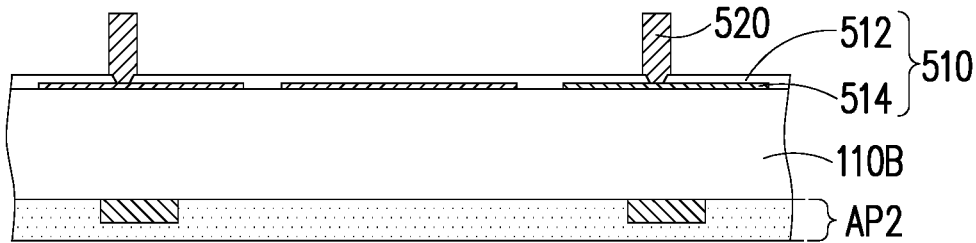

Referring to FIG. 7G, after forming the first redistribution structure 510, a conductive element 520 may be formed on the first redistribution structure 510. In some embodiments, for forming the conductive element 520, a patterned sacrificial layer (not shown) having at least one opening may be formed over the first redistribution structure 510, and the openings of the patterned sacrificial layer may be in communication with the openings 512a of the first patterned dielectric layer 512. Subsequently, a conductive material (not shown) may be deposited in the openings of the patterned sacrificial layer to be in direct contact with the first circuit pattern 514. Afterwards, the patterned sacrificial layer may be removed to remain the conductive material on the first redistribution structure 510 so as to form the conductive elements 520 electrically and physically connected to the first circuit pattern 514. In alternative embodiments, the conductive element described in FIG. 6A may be used to form on the first redistribution structure 510.

Figure 7H:
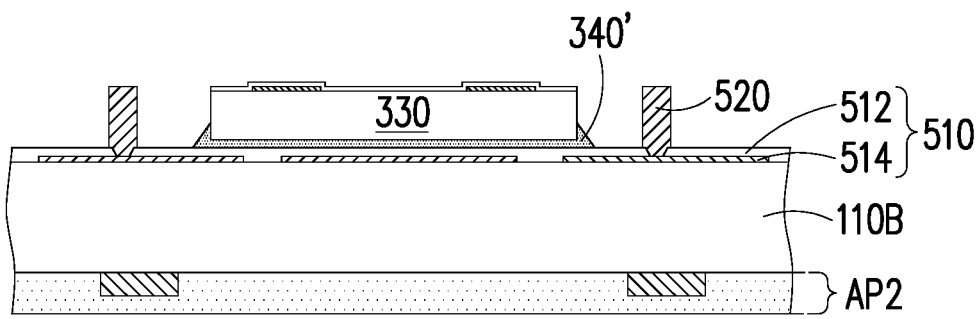

Referring to FIG. 7H, after forming the conductive element 520, the semiconductor chip 330 may be disposed on the first redistribution structure 510. In some embodiments, the semiconductor chip 330 is provided with an attaching layer 340'. After disposing the semiconductor chip 330, the attaching layer 340' is adhered the rear surface 330r of the semiconductor chip 330 to the first patterned dielectric layer 512. The region of the first redistribution structure 510 where the semiconductor chip 330 is disposed may be substantially flat without any opening to expose the core dielectric layer 110B, so that the attaching layer 340' has no protruding portion to be in contact with the first circuit pattern 514 and the core dielectric layer 110B. After disposing the semiconductor chip 330, the subsequent steps (e.g., the formations of insulating encapsulation 350, second redistribution structure 360, conductive terminal 370, and the singulation) may be similar to the descriptions in FIG. 1I and FIG. 1J, so the detailed descriptions are not repeated herein.

Figure 7I:
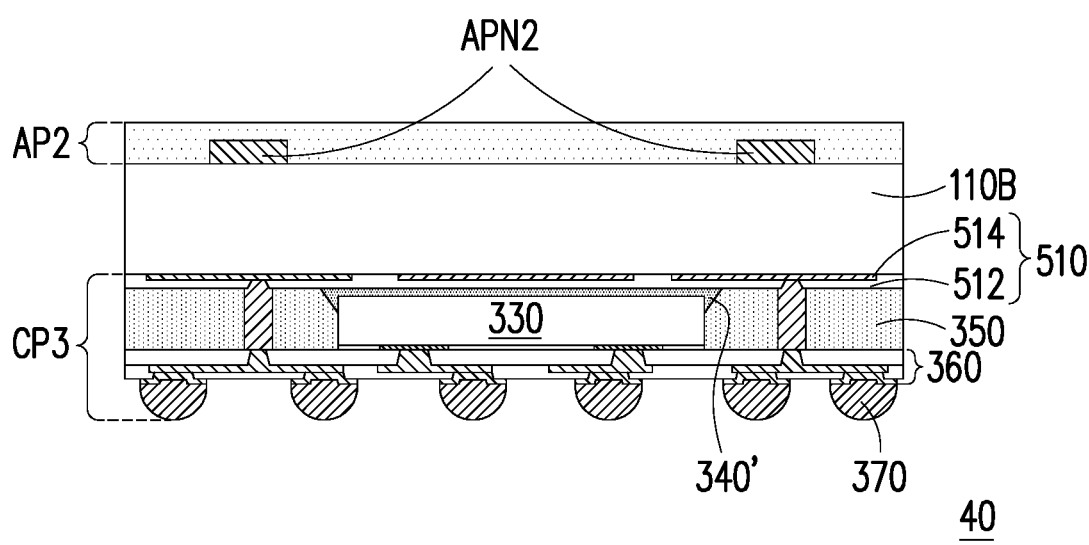

Referring to FIG. 7I, after performing a singulation process, an electronic device 40 is formed. For example, a chip package CP3 of the electronic device 40 includes the antenna pattern APN2 formed by the treated first conductive layer 110A" (shown in FIG. 7B) and the first circuit pattern 514 of the chip package CP3 formed by the treated second conductive layer 110C", thereby achieving process simplicity and reducing the manufacturing cost.

Figure 8A:
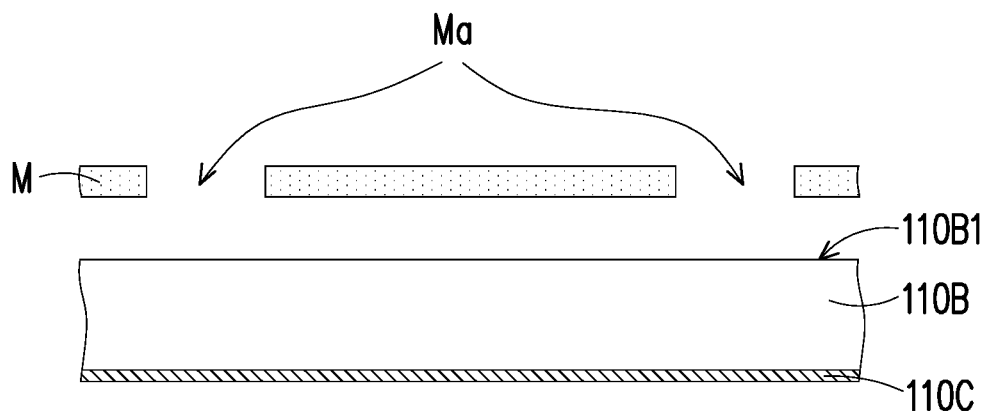
FIG. 8A to FIG. 8E are schematic cross-sectional views of various stages in a manufacturing method of an electronic device in accordance with some embodiments of the disclosure.
Figure 8B:
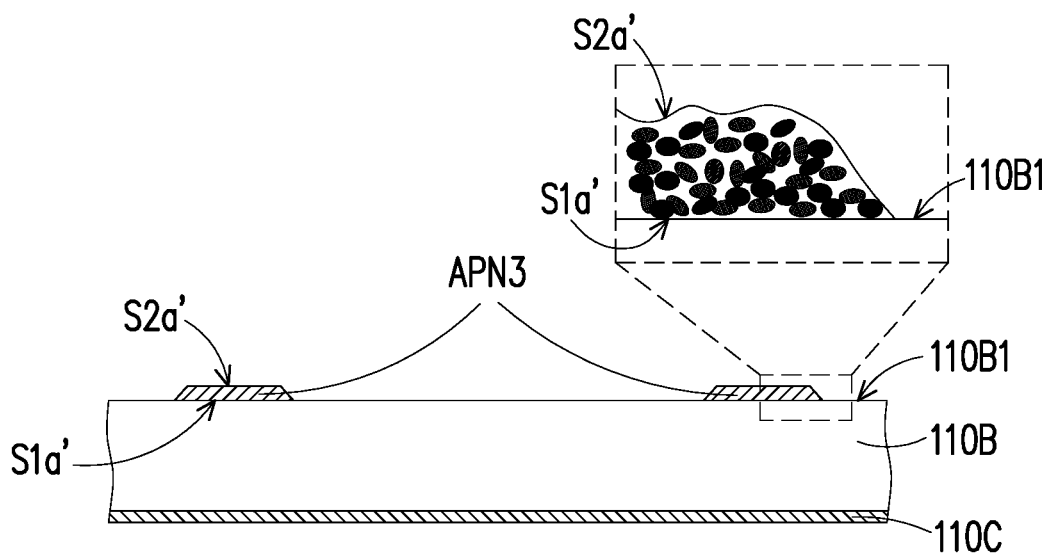

FIG. 8A to FIG. 8E are schematic cross-sectional views of various stages in a manufacturing method of an electronic device in accordance with some embodiments of the disclosure. Referring to FIG. 8A and FIG. 8B, the first surface 110B1 of the core dielectric layer 110B may be exposed. For example, after providing the composite structure 100, the first conductive layer 110A may be removed to expose the first surface 110B1. In alternative embodiments, the composite structure may be provided with a single-sided conductive layer.

An antenna pattern APN3 may be made from a conductive paste (e.g., a copper paste, silver paste, or other suitable metallic paste) and may be formed by a printing process, such as a screen printing process or a stencil printing process. For example, a mask plate M (e.g., stencil or screen) having at least one aperture Ma may be placed above the first surface 110B1 of the core dielectric layer 110B. Subsequently, the conductive paste may be applied onto the first surface 110B1 through the apertures Ma of the mask plate M to form the antenna pattern APN3. The conductive paste at least includes conductive particles mixed with a binder. For example, the conductive particles may be sparsely distributed in the binder. In some embodiments, a curing process is performed to solidify the applied conductive paste to form the antenna pattern APN3. In some embodiments, the antenna pattern APN3 after the curing process may have a trapezoid profile. For example, the antenna pattern APN3 includes the first surfaces S1a' contacting the first surface 110B1 of the core dielectric layer 110B and the second surfaces S2a' opposite to the first surfaces S1a', and a surface area of the first surfaces S1a' is greater than a surface area of the second surfaces S2a'. The antenna pattern APN3 formed by printing may result in a non-uniform thickness. For example, as shown in FIG. 8B, the second surfaces S2a' of the antenna pattern APN3 may be rough and may not be smooth.

Figure 8C:
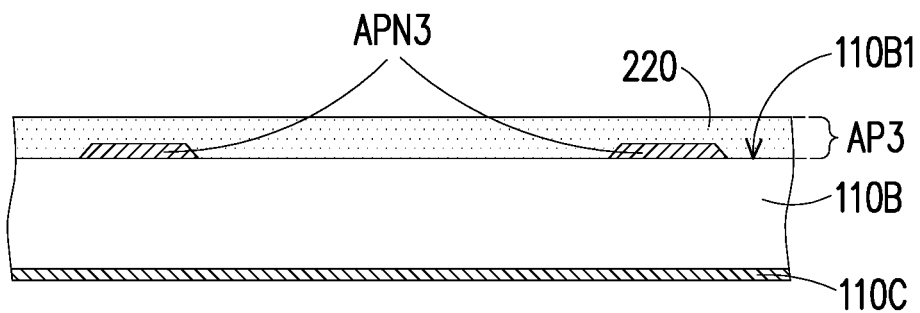
Figure 8D:
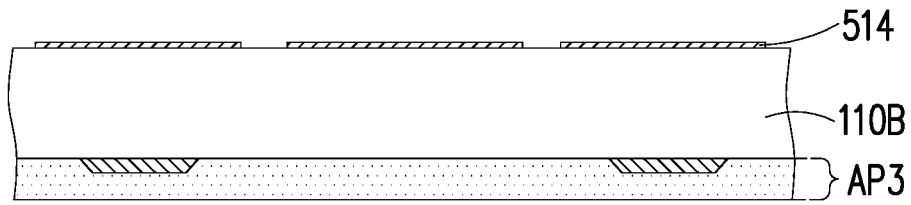

Referring to FIG. 8C and FIG. 8D, the protection layer 220 may be formed over the first surface 110B1 of the core dielectric layer 110B to encapsulate the antenna pattern APN3 so as to form an antenna package AP3. The forming process of the protection layer 220 may be similar to the descriptions in FIG. 1D, and the detailed descriptions are not repeated herein. Subsequently, the structure may be overturned, and the second conductive layer 110C may be thinned and patterned to form the first circuit pattern 514. The forming process of the first circuit pattern 514 may be similar to the descriptions in FIG. 7E and FIG. 7F, and the detailed descriptions are not repeated herein. After forming the first circuit pattern 514, the subsequent steps (e.g., the formations of the rest components of the chip package CP3 and the singulation) may be similar to the descriptions in FIG. 7F and FIG. 7H, so the detailed descriptions are not repeated herein.

Figure 8E:
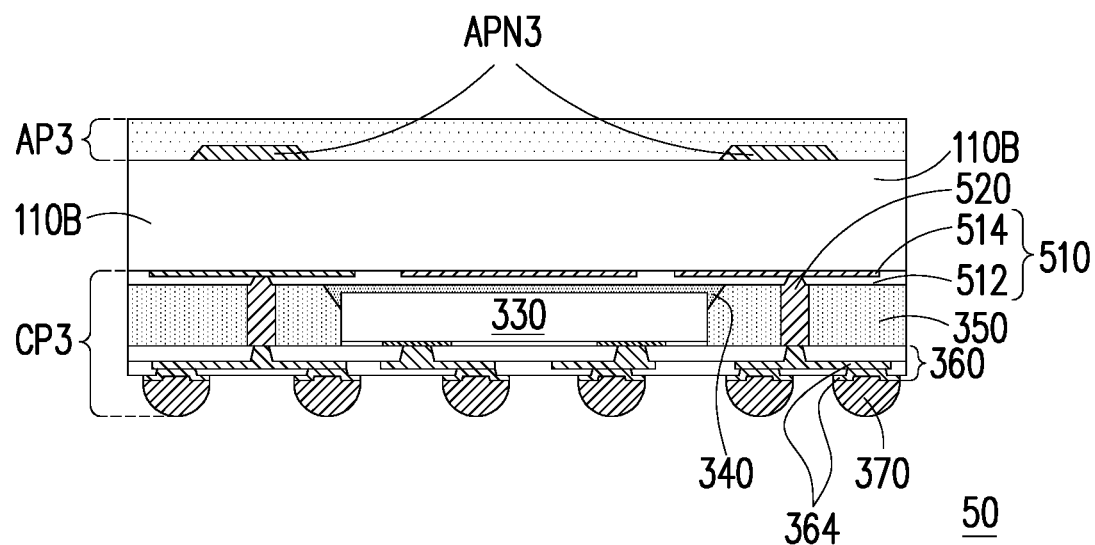

Referring to FIG. 8E, after performing a singulation process, an electronic device 50 is formed. In some embodiments, a thickness uniformity of the antenna pattern APN3 of the electronic device 50 formed by printing is lower than a thickness uniformity of the second circuit pattern 364 of the second redistribution structure 360 of the chip package CP3 formed by plating. In some embodiments, the thickness uniformity of the antenna pattern APN3 is lower than a thickness uniformity of the first circuit pattern 514 of the first redistribution structure 510. A surface roughness of the antenna pattern APN3 may be greater than the second circuit pattern 364 or may be greater than the first circuit pattern 514.

Figure 9A:
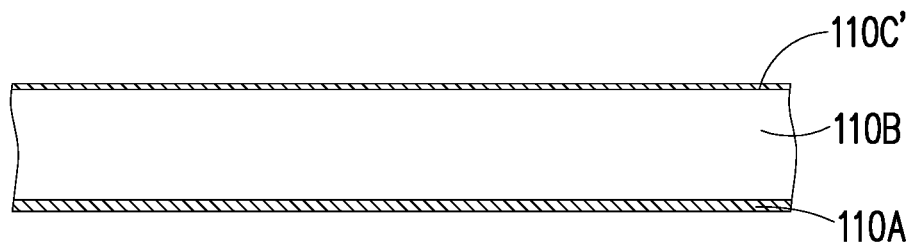
FIG. 9A to FIG. 9G are schematic cross-sectional views of various stages in a manufacturing method of an electronic device in accordance with some embodiments of the disclosure.
Figure 9B:
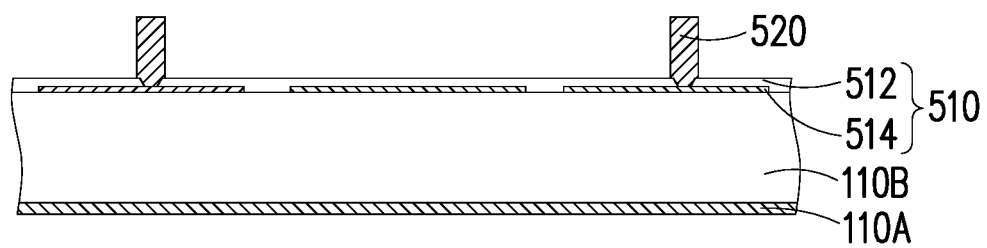

FIG. 9A to FIG. 9G are schematic cross-sectional views of various stages in a manufacturing method of an electronic device in accordance with some embodiments of the disclosure. The manufacturing method show in FIG. 9A to FIG. 9G may be viewed as a method of forming a chip package first type. Referring to FIG. 9A and FIG. 9B, the second conductive layer 110C of the composite structure 100 may be thinned to form the thinned second conductive layer 110C'. Next, the thinned second conductive layer 110C' may be patterned to form the first circuit pattern 514, and the first patterned dielectric layer 512 is formed over the first circuit pattern 514 to form the first redistribution structure 510. Subsequently, the conductive elements 520 are formed on the first redistribution structure 510 to electrically connect the first circuit pattern 514. The forming processes of the first redistribution structure 510 and the conductive elements 520 may be similar to the descriptions in FIG. 7E to FIG. 7G, so the detailed descriptions are not repeated herein.

Figure 9C:
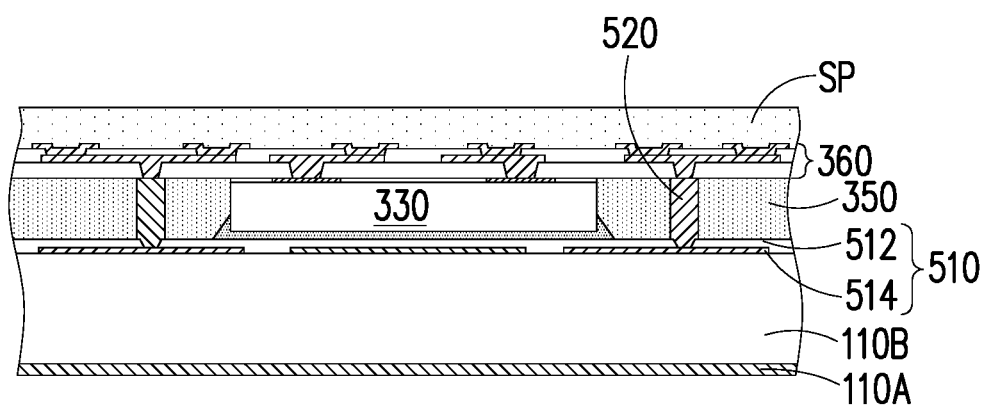
Figure 9D:
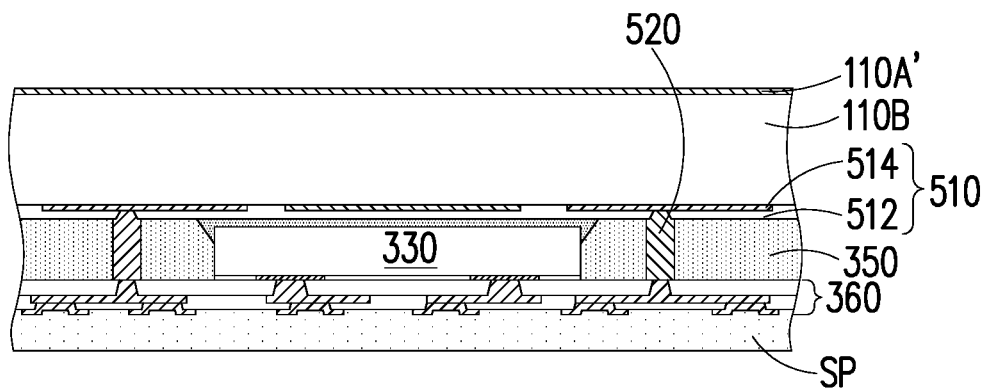

Referring to FIG. 9C and FIG. 9D, after forming the conductive elements 520, the subsequent steps (e.g., the configuration of semiconductor chip 330, the formations of insulating encapsulation 350, and second redistribution structure 360) may be similar to the descriptions in FIG. 7G and FIG. 7H, so the detailed descriptions are not repeated herein. After forming the second redistribution structure 360, a sacrificial protection layer SP may be formed over the second redistribution structure 360 using lamination, spin coating, or applicable techniques. In some embodiments, the sacrificial protection layer SP includes release materials, such as a film of light-to-heat-conversion (LTHC) release coating and a film of associated adhesive for enhancing the releasability to the second redistribution structure 360 in the subsequent process. In some embodiments, the sacrificial protection layer SP includes rigid materials for providing structural support during subsequent processing. Next, as shown in FIG. 9D, the structure may be overturned to thin the first conductive layer 110A so as form the thinned first conductive layer 110A'.

Figure 9E:
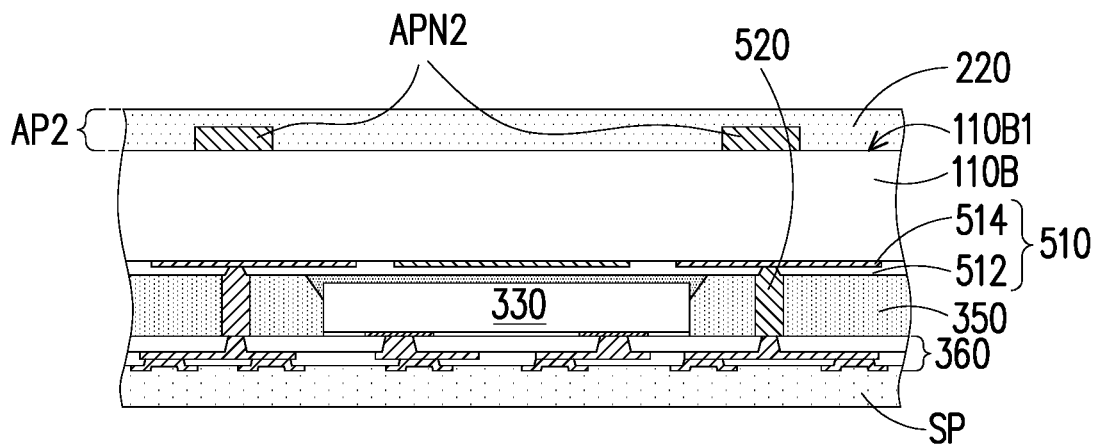

Referring to FIG. 9E, the antenna pattern APN2 may be formed on the first surface 110B1 of the core dielectric layer 110B. For example, after forming the thinned first conductive layer 110A', a conductive material may be formed on the thinned first conductive layer 110A', and then part of the thinned first conductive layer 110A' exposed by the conductive material may be removed to form the antenna pattern APN2. Next, the protection layer 220 may be formed over the first surface 110B1 of the core dielectric layer 110B to encapsulate the antenna pattern APN2 so as to form an antenna package AP2. The forming process of the antenna package AP2 may be similar to the descriptions in FIG. 7A to FIG. 7D, so the detailed descriptions are not repeated herein.

Figure 9F:
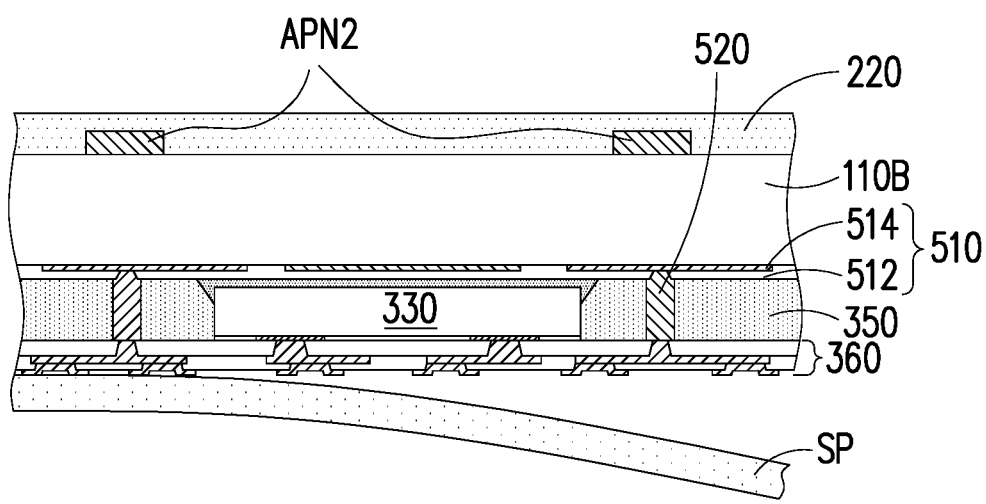
Figure 9G:
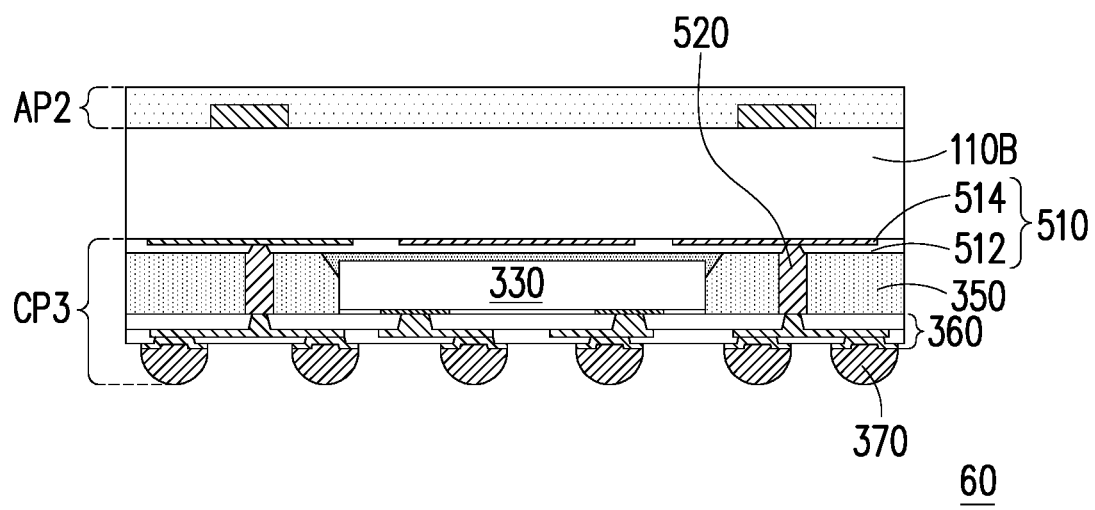

Referring to FIG. 9F and FIG. 9G, after forming the antenna package AP2, the sacrificial protection layer SP may be removed to expose the second redistribution structure 360. For example, suitable light illumination (e.g., ultraviolet light, laser irradiation, etc.) may be applied to reduce or lose the bonds of the sacrificial protection layer SP so that the sacrificial protection layer SP may be separated from the remaining structure. Other removal processes, such as stripping, etching, may be utilized to separate the sacrificial protection layer SP. A cleaning process is optionally performed on the second redistribution structure 360 before conducting the next process.

After the second redistribution structure 360 is exposed, the subsequent steps (e.g., the formations of conductive terminal 370 and singulation) similar to the descriptions in FIG. 1J and FIG. 1K may be performed, and the detailed descriptions are not repeated herein. In alternative embodiments, before forming the sacrificial protection layer SP, the conductive terminal 370 may be formed on the second redistribution structure 360, and then the structure may be overturned to place on the sacrificial protection layer SP (e.g., holding tapes, or the like) for performing processes on the first conductive layer 110A. After performing a singulation process, an electronic device 60 including the antenna package AP2 and the chip package CP3 is formed as shown in FIG. 9G.

Figure 10A:
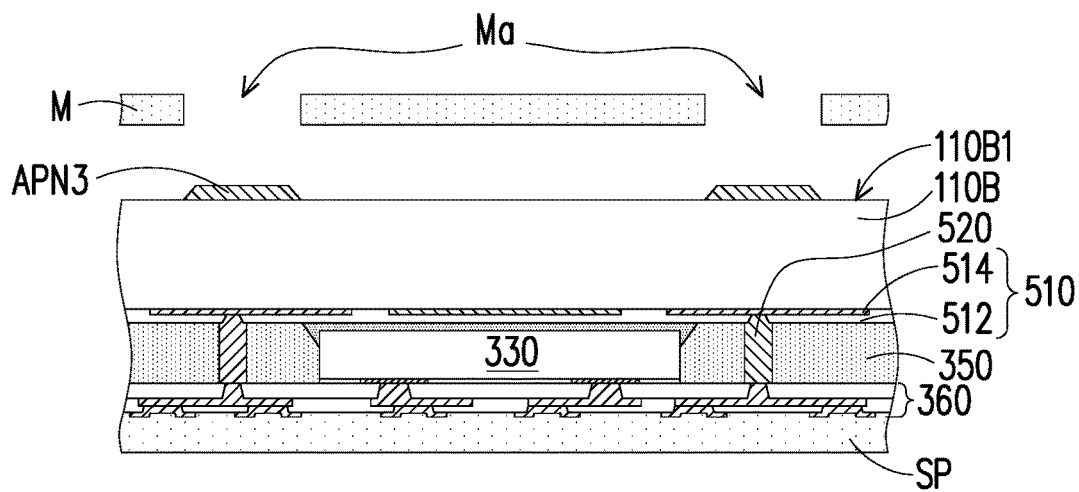
FIG. 10A to FIG. 10C are schematic cross-sectional views of various stages in a manufacturing method of an electronic device in accordance with some embodiments of the disclosure.
Figure 10B:
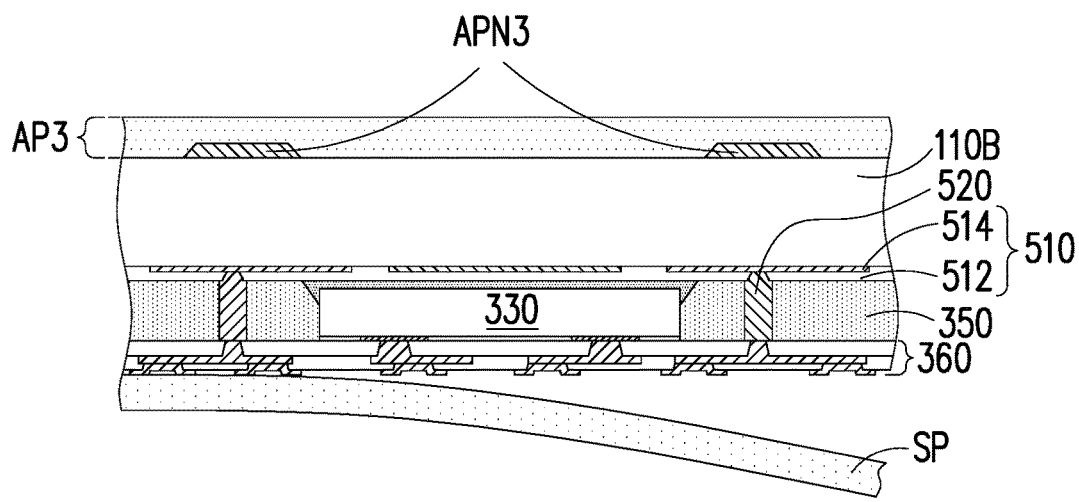
Figure 10C:
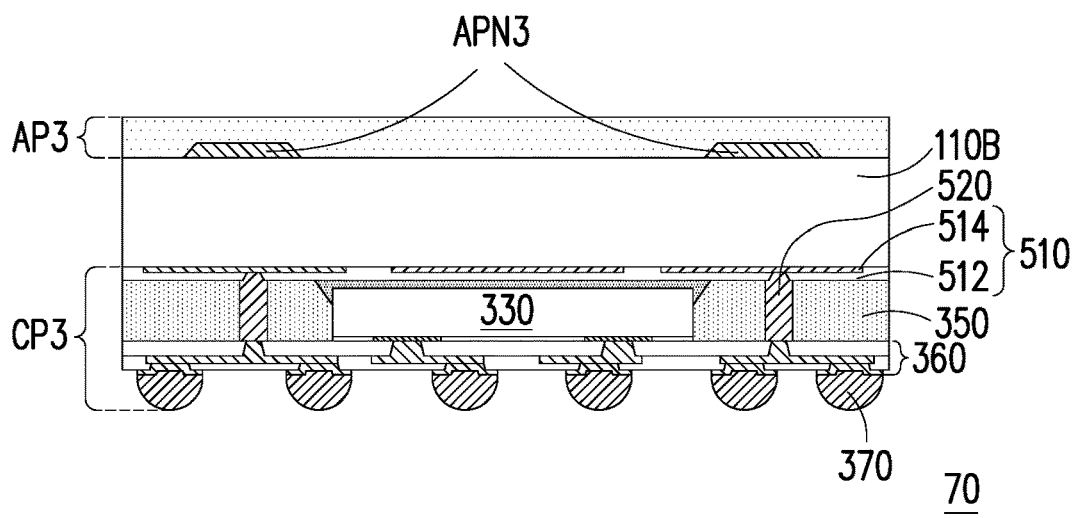

FIG. 10A to FIG. 10C are schematic cross-sectional views of various stages in a manufacturing method of an electronic device in accordance with some embodiments of the disclosure. The preceding processes may be similar to the descriptions in FIG. 9A to FIG. 9D, and the detailed descriptions are omitted for brevity. Referring to FIG. 10A, after covering the second redistribution structure 360 by the sacrificial protection layer SP, the structure is flipped upside down to remove the first conductive layer 110A and expose the first surface 110B1 of the core dielectric layer 110B. Next, the mask plate M having the apertures Ma may be placed above the first surface 110B1 of the core dielectric layer 110B, and then the conductive paste may be applied onto the first surface 110B1 through the apertures Ma of the mask plate M so as to form the antenna pattern APN3. The forming process of the antenna pattern APN3 may be similar to the descriptions in FIG. 8A and FIG. 8B, so the detailed descriptions are not repeated herein.

Referring to FIG. 10B and FIG. 10C, after forming the antenna pattern APN3, the protection layer 220 may be formed over the first surface 110B1 of the core dielectric layer 110B to encapsulate the antenna pattern APN3 so as to form the antenna package AP3. Subsequently, the sacrificial protection layer SP may be removed to expose the second redistribution structure 360. The removal process of the sacrificial protection layer SP may be similar to the descriptions in FIG. 9F, so the detailed descriptions are not repeated herein. After exposing the second redistribution structure 360, the conductive terminal 370 may be formed on the second redistribution structure 360 for further electrical connection. Subsequently, a singulation process may be performed to form an electronic device 70 including the antenna package AP3 and the chip package CP3 as shown in FIG. 10C.

In accordance with some embodiments, a method of manufacturing an electronic device includes providing a core dielectric layer with two conductive layers formed on two opposite surfaces of the core dielectric layer, and removing at least a portion of each of the two conductive layers to respectively form an antenna pattern and a circuit pattern of a chip package at the two opposite surfaces of the core dielectric layer.

In accordance with some embodiments, a method of manufacturing an electronic device includes at least the following steps. A composite structure is formed, where the composite structure includes a core dielectric layer, a first conductive layer, and a second conductive layer. The core dielectric layer includes a first surface, a second surface opposite to the first surface, and an alignment mark. The first conductive layer is formed on the first surface of the core dielectric layer, and the second conductive layer is formed on the second surface of the core dielectric layer. The first conductive layer and the second conductive layer are patterned to respectively form an antenna pattern and a circuit pattern through the alignment mark. The antenna pattern is encapsulated to form an antenna package. A plurality of semiconductor chips disposed on the circuit pattern is encapsulated to form a chip package, where the semiconductor chips are electrically coupled to the circuit pattern and the antenna pattern. The antenna package, the chip package, and the core dielectric layer disposed therebetween are cut into a plurality of electronic devices.

In accordance with some embodiments, a method of manufacturing an electronic device includes at least the following steps. A chip package is formed on a core dielectric layer, where the chip package includes a semiconductor chip, an insulating encapsulation encapsulating the semiconductor chip, and a redistribution structure electrically coupled to the semiconductor chip. The redistribution structure includes a circuit pattern and a patterned dielectric layer, where the circuit pattern is formed at an outermost side of the chip package and directly formed on the core dielectric layer, and the patterned dielectric layer is formed on the circuit pattern and covered by the insulating encapsulation. An antenna package is formed on the core dielectric layer, where the antenna package and the chip package are formed at two opposing sides of the core dielectric layer, and the antenna package is electrically coupled to the chip package.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of manufacturing an electronic device, comprising:
    forming a composite structure, wherein the composite structure comprises:
        a core dielectric layer comprising a first surface, a second surface opposite to the first surface, and an alignment mark;
        a first conductive layer formed on the first surface of the core dielectric layer; and
        a second conductive layer formed on the second surface of the core dielectric layer;
    patterning the first conductive layer and the second conductive layer to respectively form an antenna pattern and a circuit pattern through the alignment mark;
    encapsulating the antenna pattern to form an antenna package;
    encapsulating a plurality of semiconductor chips disposed on the circuit pattern to form a chip package, wherein the semiconductor chips are electrically coupled to the circuit pattern and the antenna pattern; and cutting the antenna package, the chip package, and the core dielectric layer disposed therebetween into a plurality of electronic devices.

2. The method of claim 1, wherein patterning the first conductive layer comprises:
   forming a patterned mask on the first conductive layer, wherein the patterned mask exposes a portion of the first conductive layer, and
   removing the portion of the first conductive layer to form the antenna pattern with a first undercut.

3. The method of claim 2, wherein forming the antenna pattern with the first undercut comprises:
   performing a wet etching process which is selective to a material of the first conductive layer.

4. The method of claim 1, wherein patterning the second conductive layer comprises:
   forming a patterned dielectric layer on the second conductive layer, wherein the patterned dielectric layer exposes a portion of the second conductive layer, and
   removing the portion of the second conductive layer to form the circuit pattern with a second undercut.

5. The method of claim 4, wherein forming the circuit pattern with the second undercut comprises:
   performing a wet etching process which is selective to a material of the second conductive layer.

6. The method of claim 1, wherein patterning the second conductive layer comprises:
   thinning the second conductive layer to form a thinned conductive layer; and
   removing a portion of the thinned conductive layer to form the circuit pattern.

7. The method of claim 1, wherein forming the chip package comprises:
   attaching a back surface of each of the plurality of semiconductor chips to the core dielectric layer by forming an attaching layer between the back surface and the core dielectric layer, wherein during the attaching, the attaching layer fills a spacing of the circuit pattern to be in contact with the core dielectric layer.

8. The method of claim 1, wherein forming the chip package comprises:
   attaching a conductive element to the circuit pattern through a conductive joint, wherein the conductive element is a T-shaped post.

9. The method of claim 1, wherein the alignment mark of the core dielectric layer comprises a plurality of recesses distributed along a periphery of the core dielectric layer.

* * * * *